(12) United States Patent
Matsumoto et al.

(10) Patent No.: US 9,046,668 B2
(45) Date of Patent: Jun. 2, 2015

(54) OPTICAL MODULE

(75) Inventors: Takuya Matsumoto, Mie (JP); Nobuyuki Asahi, Mie (JP); Yutaka Kinugasa, Osaka (JP); Tadahiro Yamaji, Mie (JP); Makoto Nishimura, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 11 days.

(21) Appl. No.: 14/124,495

(22) PCT Filed: Jun. 14, 2012

(86) PCT No.: PCT/JP2012/003904
§ 371 (c)(1),
(2), (4) Date: Dec. 6, 2013

(87) PCT Pub. No.: WO2012/176409
PCT Pub. Date: Dec. 27, 2012

(65) Prior Publication Data
US 2014/0119690 A1 May 1, 2014

(30) Foreign Application Priority Data

Jun. 22, 2011 (JP) ................................ 2011-137962
Sep. 7, 2011 (JP) ................................ 2011-194766

(51) Int. Cl.
*G02B 6/12* (2006.01)
*G02B 6/43* (2006.01)
(Continued)

(52) U.S. Cl.
CPC ............ *G02B 6/43* (2013.01); *H01S 5/02252* (2013.01); *H01S 5/02284* (2013.01); *G02B 6/4214* (2013.01); *G02B 6/423* (2013.01); *G02B 6/3636* (2013.01); *G02B 6/4249* (2013.01)

(58) Field of Classification Search
CPC .... G02B 6/3636; G02B 6/4214; G02B 6/423; G02B 6/4249; G02B 6/43; H01S 5/02252; H01S 5/02284

USPC .............................................. 385/14; 216/24
See application file for complete search history.

(56) References Cited

U.S. PATENT DOCUMENTS

| 4,897,711 A | 1/1990 | Blonder et al. |
| 5,896,481 A * | 4/1999 | Beranek et al. ................ 385/90 |

(Continued)

FOREIGN PATENT DOCUMENTS

| JP | 08-264748 A | 10/1996 |
| JP | 0954228 | 2/1997 |

(Continued)

OTHER PUBLICATIONS

International Search Report issued in International Application No. PCT/JP2012/003904 with Date of mailing Sep. 18, 2012, with English Translation.

(Continued)

*Primary Examiner* — Peter Radkowski
(74) *Attorney, Agent, or Firm* — McDermott Will Emery LLP

(57) ABSTRACT

There is provided an optical module in which leaked light or the like from a plurality of optical elements on the same substrate is made less likely to affect adjacent optical elements, and a cross-talk noise can be thereby significantly reduced. The optical module includes an internal waveguide in a first trench of a substrate, a mirror section, and optical elements. A plurality of the first trenches of the substrate are formed independently of each other and substantially in parallel with each other, and lengths of adjacent first trenches from the end surface of the substrate are made different from each other. The optical elements are mounted on the surface of the substrate so as to oppose the minor sections formed at the tip portions of the first trenches having the different lengths.

15 Claims, 27 Drawing Sheets

(51) Int. Cl.
*G02B 6/42* (2006.01)
*H01S 5/022* (2006.01)
*G02B 6/36* (2006.01)

(56) References Cited

U.S. PATENT DOCUMENTS

| | | |
|---|---|---|
| 6,513,993 B1 | 2/2003 | Nakanishi et al. |
| 2001/0026670 A1* | 10/2001 | Takizawa et al. ............. 385/129 |
| 2002/0181853 A1 | 12/2002 | Ido et al. |
| 2003/0190124 A1* | 10/2003 | Kuhara ........................... 385/88 |
| 2005/0163420 A1* | 7/2005 | Kuhara ........................... 385/16 |
| 2007/0206907 A1 | 9/2007 | Mizoguchi et al. |
| 2009/0067799 A1* | 3/2009 | Nakane ......................... 385/131 |

FOREIGN PATENT DOCUMENTS

| | | | | |
|---|---|---|---|---|
| JP | 09054228 A | * | 2/1997 | ............... G02B 6/42 |
| JP | 2001-094125 A | | 4/2001 | |
| JP | 2001-100062 A | | 4/2001 | |
| JP | 2003-294964 A | | 10/2003 | |
| JP | 2007-003622 A | | 1/2007 | |
| JP | 2007-267358 A | | 10/2007 | |
| JP | 2008091516 | | 4/2008 | |
| JP | 2011-095295 A | | 5/2011 | |

OTHER PUBLICATIONS

Taiwanese Office Action and Search Report issued in corresponding Taiwanese Application No. 101122048 dated Apr. 22, 2014, w/Partial English translation.

* cited by examiner

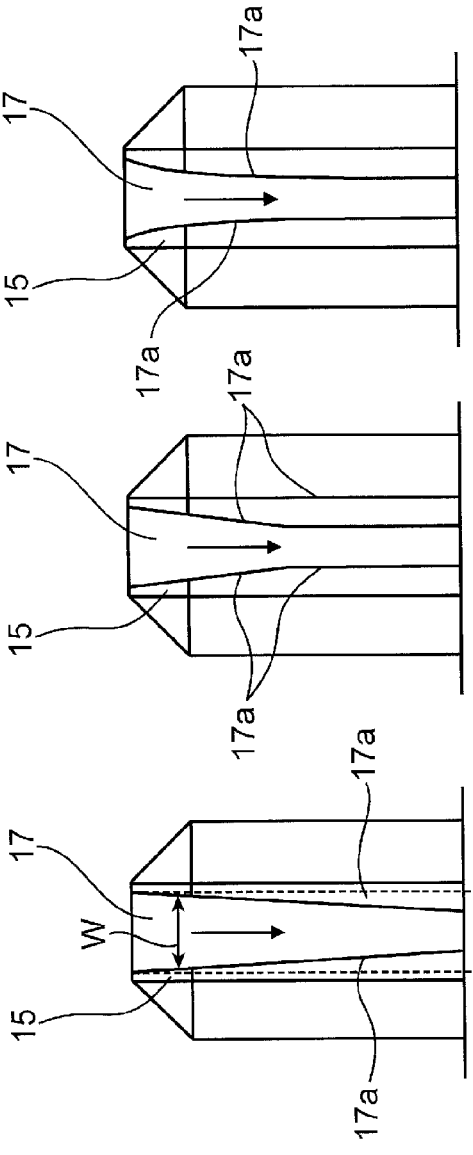

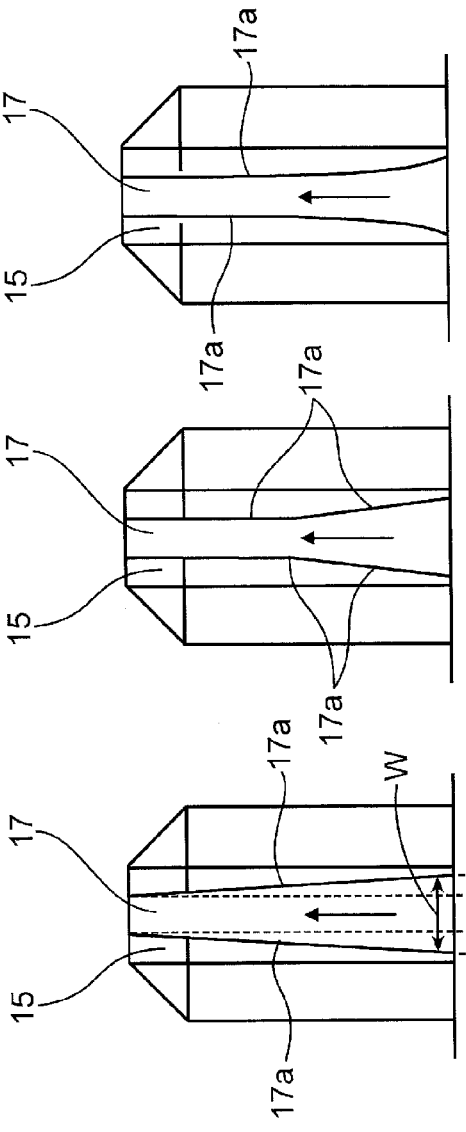

OPTICAL MODULE

RELATED APPLICATIONS

This application is the U.S. National Phase under 35 U.S.C. §371 of International Application No. PCT/JP2012/003904, filed Jun. 14, 2012, which in turn claims the benefit of Japanese Application No. 2011-137962, filed on Jun. 22, 2011 and Japanese Application No. 2011-194766, filed on Sept. 7, 2011, the disclosures of which Applications are incorporated by reference herein.

TECHNICAL FIELD

The present invention relates to an optical module including an optical element.

BACKGROUND ART

Conventionally, there is known an optical module that includes an internal waveguide, a mirror section for changing an optical path, an optical element, and an external waveguide. The internal waveguide is provided in a trench formed in the surface of a substrate. The mirror section for changing the optical path is formed at the tip portion of the trench. In addition, the optical element is mounted on the surface of the substrate so as to oppose the mirror section. The optical element emits an optical signal to a core section of the internal waveguide via the mirror section, or receives the optical signal from the core section of the internal waveguide via the mirror section. The external waveguide has a core section optically coupled to the core section of the internal waveguide.

In such an optical module, in order to achieve bidirectional transmission or an increase in transmission capacity, it is necessary to use a plurality of the optical modules. As a result, a device including a plurality of the optical module is increased in size. To cope with this, it is desired to implement the optical module that is small in size, low in height, and capable of bidirectional or multi-channel transmission.

In order to implement such an optical module, it is conceived to mount a plurality of the optical elements on the surface of the substrate such that the optical elements are disposed close to each other. In this case, it is necessary to form the internal waveguides and the mirror sections at a small pitch so as to correspond to the interval of the plurality of the optical elements.

Conventionally, like an optical module described in Patent Document 1, there is proposed an optical module in which a plurality of optical transmission paths having different lengths from the end surface of the substrate are formed on the substrate, the optical elements are disposed close to each other at the ends of the individual optical transmission paths, and each of the optical elements is a light-emitting element or a light-receiving element. In this optical module, countermeasures against a cross-talk noise are not taken.

In a case where a plurality of the optical elements are close to each other, and the internal waveguides and the mirror sections are formed so as to reduce the pitch between the internal waveguides and the pitch between the mirror sections, leaked light from the optical element or scattered light from the mirror section or the internal waveguide enters the mirror section and the internal waveguide of the adjacent optical element, and the cross-talk noise is thereby generated. Such a cross-talk noise causes a transmission error. Consequently, it is requested to reduce the cross-talk noise as much as possible.

Patent Document 1: Japanese Patent Application Laid-open No. 2003-294964

SUMMARY OF THE INVENTION

An object of the present invention is to provide an optical module small in size and low in height in which leaked light or the like from a plurality of optical elements on the same substrate is made less likely to affect the adjacent optical elements and a cross-talk noise can be thereby reduced significantly.

The present invention is an optical module including a substrate that is formed with a plurality of first trenches in a surface thereof, an internal waveguide that is provided in each of the plurality of first trenches and has a core section, a mirror section for changing an optical path, formed at each of tip portions of the plurality of first trenches, and an optical element that is mounted on the surface of the substrate so as to oppose the mirror section, and emits an optical signal to the core section of the internal waveguide via the mirror section or receives the optical signal from the core section of the internal waveguide via the mirror section, wherein the plurality of first trenches of the substrate are formed independently of each other and substantially in parallel with each other, lengths of the adjacent first trenches from an end surface of the substrate are different from each other, and the optical elements are mounted on the surface of the substrate so as to oppose the mirror sections formed at the tip portions of the first trenches having the different lengths.

A configuration can be adopted in which a plurality of the optical elements include a light-emitting element and a light-receiving element, and the light-emitting element is mounted on the surface of the substrate so as to oppose the mirror section formed at a tip portion of the internal waveguide shorter in length than the internal waveguide optically coupled to the light-receiving element.

A configuration can be adopted in which the optical module further includes an external waveguide that has a core section optically coupled to the core section of the internal waveguide, a second trench extending from the first trench of the internal waveguide is formed in the surface of the substrate, and an optical axis of the internal waveguide and an optical axis of the external waveguide are set so as to match with each other by fitting and fixing the external waveguide in and to the second trench.

A configuration can be adopted in which a partition wall portion is formed between the adjacent second trenches so as not to be separated from a partition wall portion between the adjacent first trenches.

A configuration can be adopted in which the optical module further includes an external waveguide that has a core section optically coupled to the core section of the internal waveguide, and the external waveguide is a multi-channel optical fiber.

A configuration can be adopted in which the optical module further includes the external waveguide that has the core section optically coupled to the core section of the internal waveguide, and the external waveguide is a multi-channel film-like flexible waveguide, i.e., a flexible waveguide film.

A configuration can be adopted in which a convex layer made of a material identical with a material of a cladding section of the internal waveguide is formed on the surface of the substrate between the optical elements.

A configuration can be adopted in which the optical module further includes an external waveguide that has a core section optically coupled to the core section of the internal waveguide, a plurality of second trenches deeper than the plurality of first trenches and each having a substantially V-shaped cross section are formed in the surface of the substrate continuously from the first trenches, and the external waveguide includes an optical fiber that has a fiber cladding section disposed in each of the plurality of second trenches and a fiber core section as the core section of the external waveguide.

A configuration can be adopted in which the optical module further includes an external waveguide that has a core section optically coupled to the core section of the internal waveguide, a plurality of second trenches deeper than the plurality of first trenches are formed in the surface of the substrate continuously from the first trenches, the external waveguide includes an optical fiber that has a fiber cladding section disposed in each of the second trenches and a fiber core section as the core section of the external waveguide, and the second trench includes a bottom surface that is formed to have a predetermined width and inclined surfaces that are connected to both ends of the bottom surface in a width direction and support an outer periphery of the fiber cladding section.

A configuration can be adopted in which the core section of the internal waveguide has an inclined surface that gradually reduces a width of the core section from the mirror section toward a connection end portion with the fiber core section of the optical fiber in a case where the optical element is a light-emitting element.

A configuration can be adopted in which the core section of the internal waveguide has an inclined surface that gradually reduces a width of the core section from a connection end portion with the fiber core section of the optical fiber toward the mirror section in a case where the optical element is a light-receiving element.

A configuration can be adopted in which the width of the core section of the internal waveguide is smaller than a width of an upper end of the first trench.

A configuration can be adopted in which the first trench has a substantially trapezoidal cross section, and a bottom surface of the first trench is wider than the core section of the internal waveguide.

A configuration can be adopted in which a third trench deeper than the second trench is formed in the surface of the substrate continuously from the second trench, and the third trench is bonded to a sheathing section of the optical fiber.

A configuration can be adopted in which the substrate is disposed on another substrate larger in size than the substrate, and a sheathing section of the optical fiber is fixed to the other substrate.

A configuration can be adopted in which the substrate is disposed on another substrate larger in size than the substrate, a sheathing body is fixed to an outer periphery of a sheathing section of the optical fiber, and the sheathing body is fixed to the other substrate.

According to the present invention, the lengths of the adjacent first trenches are different from each other, and the optical elements are mounted on the surface of the substrate so as to oppose the mirror sections formed at the tip portions of the first trenches having the above lengths. Accordingly, it is possible to secure a large distance between the adjacent optical elements disposed at different positions in a length direction, e.g., the unaligned adjacent optical elements.

Consequently, leaked light from the optical element or reflected scattered light from the mirror section or the internal waveguide becomes less likely to enter the mirror section or the internal waveguide of the adjacent optical element, and hence a cross-talk noise becomes less likely to occur. In addition, the internal waveguides are provided in the plurality of the first trenches formed independently of each other and substantially in parallel with each other, and hence the internal waveguides don't interfere with each other due to the partition wall portion between the adjacent first trenches.

Thus, a plurality of the optical elements are mounted on the substrate so as to be close to each other in a width direction, and the internal waveguides and the mirror sections are formed at a small pitch so as to correspond to an interval of the optical elements. With this, it becomes possible to implement small in size, low in height, and bidirectional or multi-channel transmission. In addition, it is possible to significantly reduce the cross-talk noise by securing the large distance between the adjacent optical elements and preventing the interference between the adjacent internal waveguides.

BRIEF DESCRIPTION OF THE DRAWINGS

FIG. 1 is a schematic side view of a single channel optical module.

[FIG. 2]

[FIG. 3]

[FIG. 4]

[FIG. 5]

[FIG. 6]

[FIG. 7]

FIG. 8 shows a modification of the first embodiment of the present invention, and is a plan view of a substrate in which a partition wall portion between second trenches is formed so as not to be separated from a partition wall portion between the first trenches.

[FIG. 9] FIG. 9 is a view showing another modification of the first embodiment of the present invention, in which

FIG. 10 is a schematic side view of the optical module according to a second embodiment of the present invention.

[FIG. 11] FIG. 11 is a view showing the first substrate of the optical module on a light-emitting side of FIG. 10, in which

[FIG. 12]

[FIG. 13]

[FIG. 14]

FIG. 15 is a front cross-sectional view showing the relationship between the bottom surface of the first trench and a core section of the internal waveguide of FIG. 10.

[FIG. 16] FIG. 16 is a view showing the first substrate of a first modification of the second embodiment of the present invention, in which

FIG. 17 is a front cross-sectional view of the first substrate of a second modification of the second embodiment of the present invention.

[FIG. 18] FIG. 18 is a view showing the first substrate of a third modification of the second embodiment of the present invention, in which

[FIG. 19] FIG. 19 is a view showing a modification of the core section of the internal waveguide on the side of the light-emitting element according to the second embodiment of the present invention, in which FIG. 19A is a plan view of the core section, FIG. 19B is a front cross-sectional view of the core section of FIG. 19A, FIG. 19C is a plan view showing another modification of the core section, and FIG. 19D is a plan view showing still another modification of the core section.

[FIG. 20] FIG. 20 is a view showing a modification of the core section of the internal waveguide on the side of a light-receiving element according to the second embodiment of the present invention, in which FIG. 20A is a plan view of the core section, FIG. 20B is a front cross-sectional view of the core section of FIG. 20A, FIG. 20C is a plan view showing another modification of the core section, and FIG. 20D is a plan view showing still another modification of the core section.

FIG. 21 is a side cross-sectional view of a first example in which a sheathing section of the optical fiber is bonded and fixed to a second substrate according to the second embodiment of the present invention.

FIG. 22 is a side cross-sectional view of a second example in which the sheathing section of the optical fiber is bonded and fixed to the second substrate according to the second embodiment of the present invention.

[FIG. 23] FIG. 23 is a view showing the first substrate of the multi-channel optical module according to the second embodiment of the present invention, in which

FIG. 24 is a view showing the first substrate as a modification of the second embodiment of the present invention, and is a cross-sectional view of the first substrate having an oxide film layer formed on the entire surface thereof.

FIG. 25 is a view showing the first substrate as another modification of the second embodiment of the present invention, and is a cross-sectional view of the first substrate in which a removal portion is formed by partially removing a portion of the oxide film layer formed on the surface of the substrate corresponding to the surface of a shielding section.

FIG. 26 is a view showing the first substrate as still another modification of the second embodiment of the present invention, and is a cross-sectional view of the first substrate in which a light absorber is disposed in the shielding section.

[FIG. 27]

[FIG. 28] FIG. 28 is a view relating to another modification of the optical module according to the second embodiment of the present invention, in which

BEST MODE FOR CARRYING OUT THE INVENTION

Hereinbelow, the best mode for carrying out the present invention will be described in detail with reference to the drawings.

(First Embodiment)

Each of FIGS. 1 to 5 shows a single channel optical module in which one internal waveguide 16 is formed in one first trench 1a of each of first substrates 1 and 3. The outline of the single channel optical module will be described first with reference to FIGS. 1 to 5 and, thereafter, a detailed description will be given of a multi-channel optical module according to a first embodiment of the present invention that includes the structure of the single channel optical module with reference to FIGS. 6 to 9.

Figure 1:
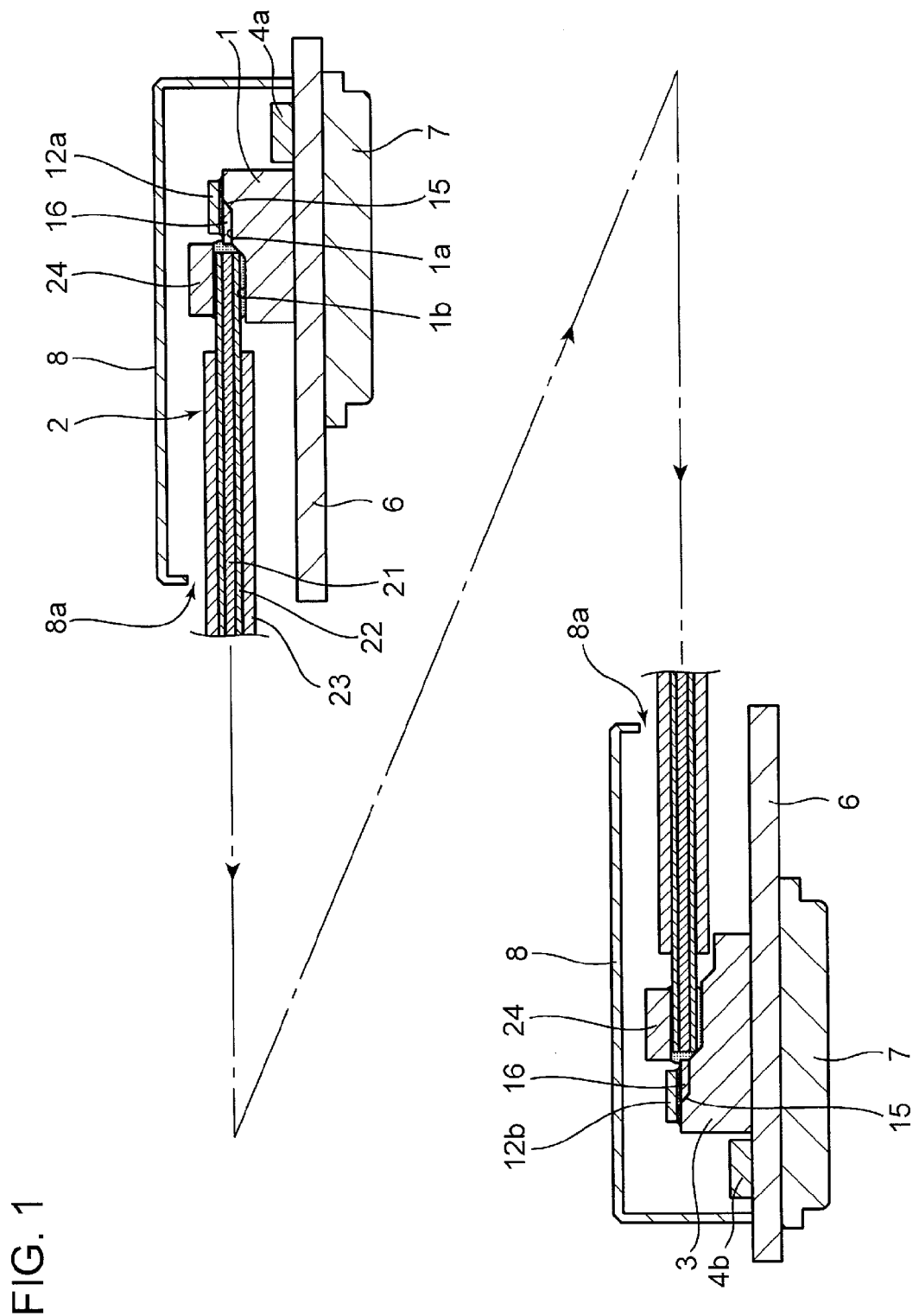
[FIG. 1]
Figure 2A:
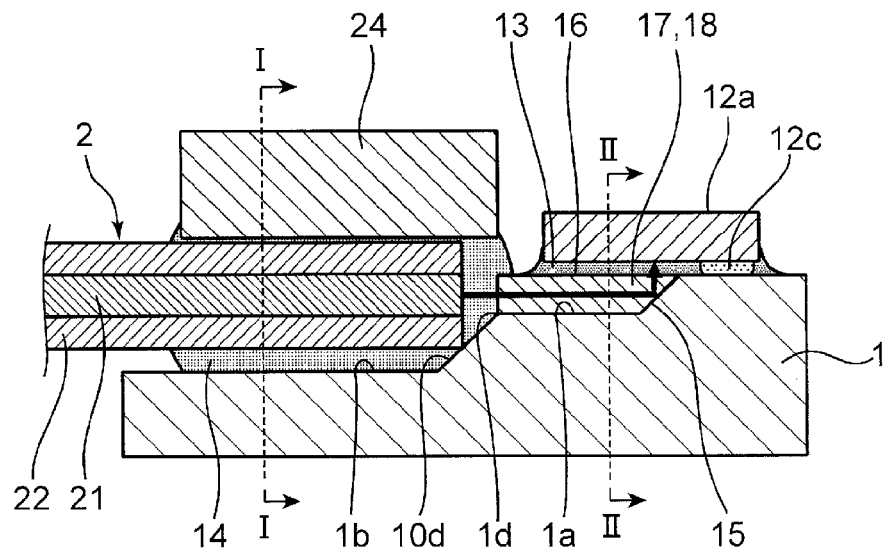
FIG. 2A is a side cross-sectional view of a first substrate of the optical module on a light-emitting side of FIG. 1.
Figure 2B:
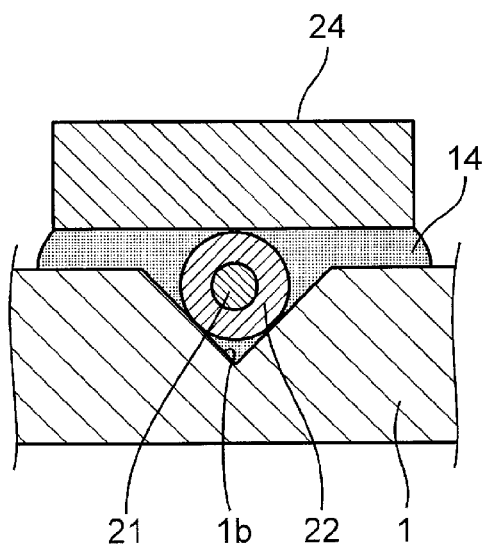
FIG. 2B is an I-I line cross-sectional view of FIG. 2A.
Figure 2C:
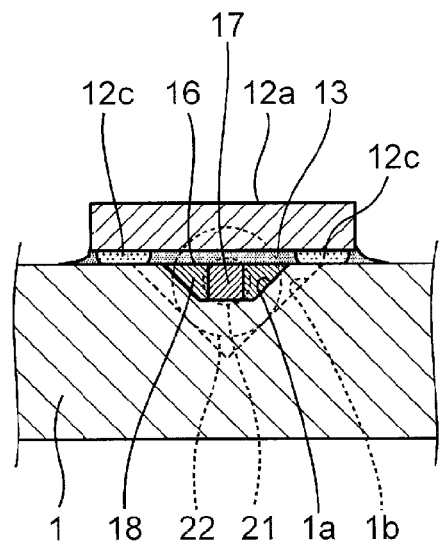
FIG. 2C is an II-II line cross-sectional view of FIG. 2A.
Figure 3A:
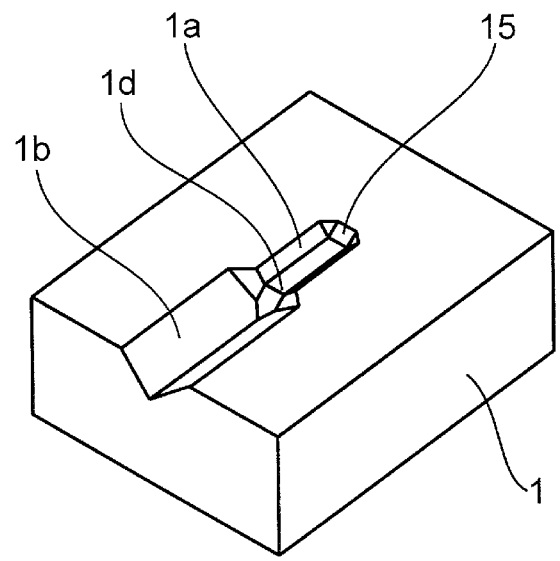
FIG. 3A is a perspective view of the first substrate of FIG. 2.
Figure 3B:
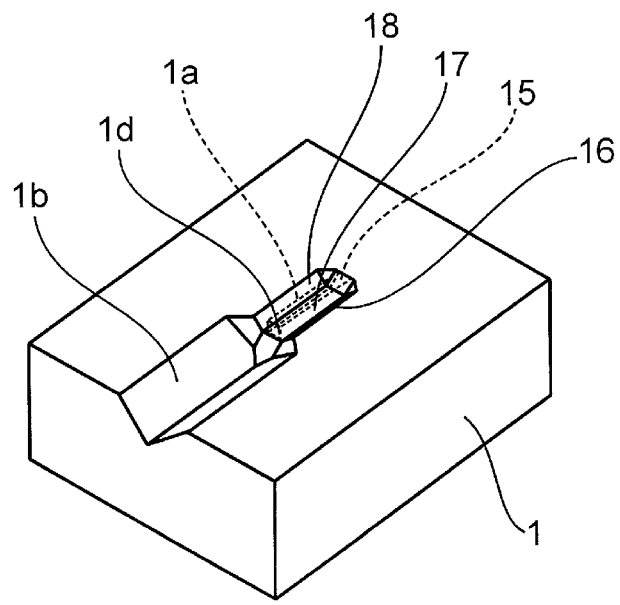
FIG. 3B is a perspective view of the first substrate of FIG. 2 formed with an internal waveguide.
Figure 4A:
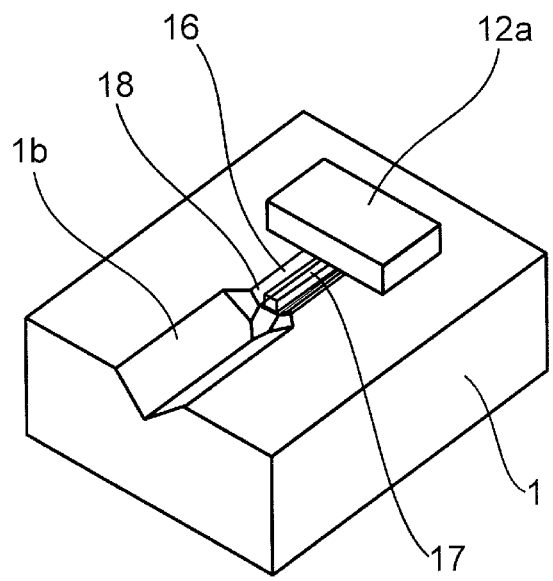
FIG. 4A is a perspective view of the first substrate on which a light-emitting element is mounted.
Figure 4B:
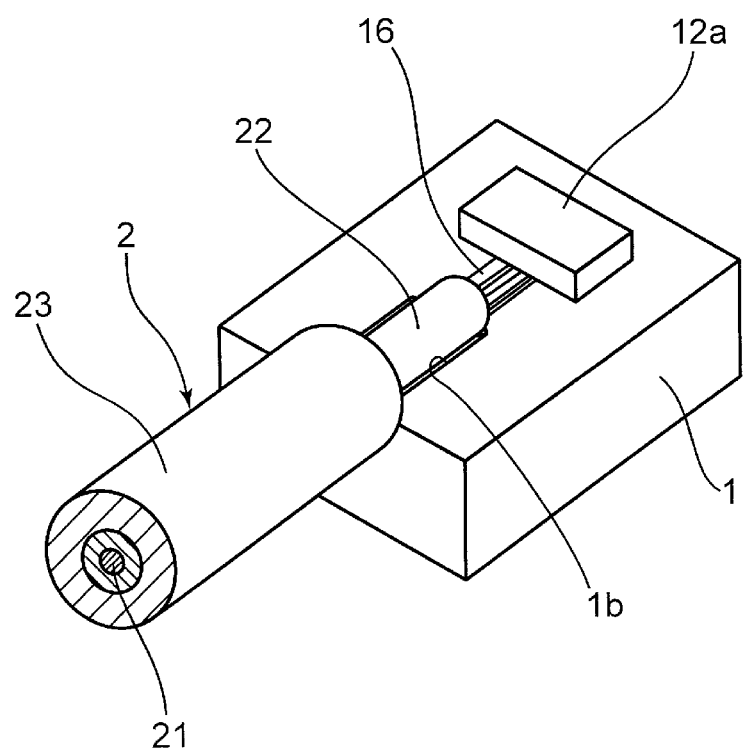
FIG. 4B is a perspective view of the first substrate into which an optical fiber is inserted.
Figure 5A:
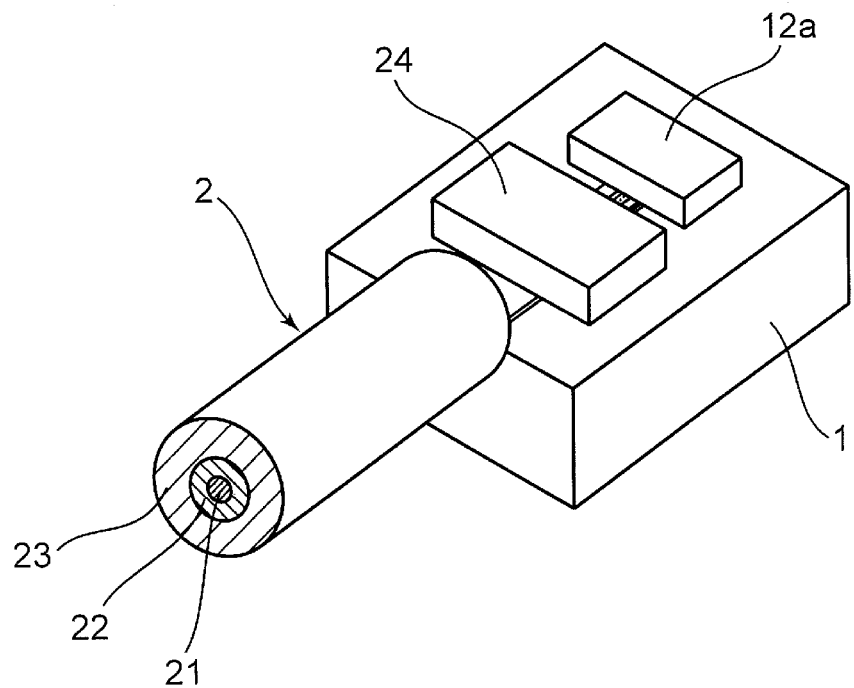
FIG. 5A is a perspective view of the first substrate to which a holding block is fixed.
Figure 5B:
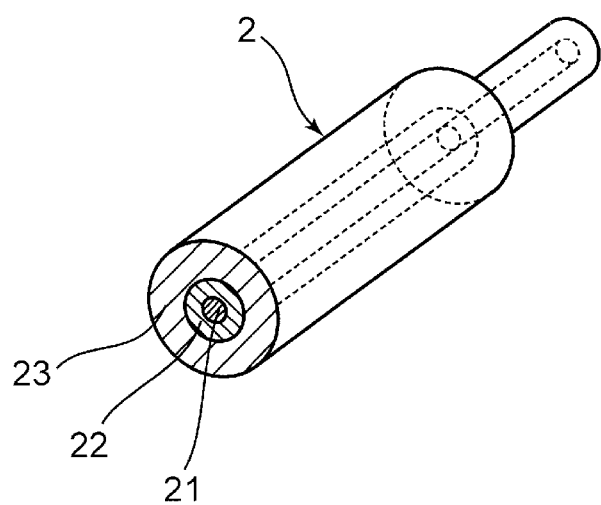
FIG. 5B is a perspective view of the optical fiber.

FIG. 1 is a schematic side view of the single channel optical module. FIGS. 2A to 2C are views showing the first substrate 1 of the optical module on a light-emitting side of FIG. 1, FIG. 2A is a side cross-sectional view of the first substrate 1, FIG. 2B is a I-I line cross-sectional view of FIG. 2A, and FIG. 2C is an II-II line cross-sectional view of FIG. 2A. FIGS. 3A and 3B are views showing the first substrate 1, FIG. 3A is a perspective view of the first substrate 1, and FIG. 3B is a perspective view of the first substrate 1 formed with the internal waveguide 16. FIGS. 4A and 4B are views showing the first substrate 1, FIG. 4A is a perspective view of the first substrate 1 on which a light-emitting element 12a is mounted, and FIG. 4B is a perspective view of the first substrate 1 into which an optical fiber 2 is inserted. FIG. 5A is a perspective view of the first substrate 1 to which a holding block 24 is fixed, and FIG. 5B is a perspective view of the optical fiber 2.

In FIG. 1, the optical module includes the first substrate (mount substrate) 1 on a light-emitting side, the first (mount) substrate 3 on a light-receiving side, and the optical fiber 2 that optically couples the first substrates 1 and 3. Note that, in the following description, a vertical direction (a direction of an arrow Y) in FIG. 1 is referred to as a vertical direction (height direction), a direction orthogonal to paper with FIG. 1 is referred to as a lateral direction (width direction), the left side in FIG. 1 is referred to as the front, and the right side in FIG. 1 is referred to as the rear.

Each of the first substrates 1 and 3 requires heat radiation properties and stiffness in order to avoid an influence by heat during mounting and an influence by a stress resulting from a usage environment. In addition, in the case of optical transmission, optical coupling efficiency of a predetermined ratio or more is required from the light-emitting element 12a to a light-receiving element 12b, and hence it is necessary to mount the light-emitting element 12a and the light-receiving element 12b with high accuracy and suppress the position fluctuation thereof during use as much as possible. Accordingly, as each of the first substrates 1 and 3, a silicon (Si) substrate is used in this single channel optical module.

In particular, when each of the first substrates 1 and 3 is the silicon substrate, it becomes possible to perform high-accuracy etching trench processing in the surface by utilizing the crystal orientation of silicon. For example, by utilizing this trench, it is possible to form a high-accuracy mirror section 15 described later and the high-accuracy internal waveguide 16. In addition, the etched surface of the silicon substrate is excellent in planarity.

The first substrates 1 and 3 are disposed on the surfaces (upper surfaces) of second substrates (interposer substrates) 6 larger in size than the first substrates 1 and 3. To the back surface (lower surface) of each second substrate 6, a connector 7 for electrical connection to other circuit devices is attached.

On the surface (upper surface) of the first substrate 1, the light-emitting element 12a for converting an electric signal to an optical signal is flip-chip mounted using a bump 12c (see FIG. 2) with its light-emitting surface faced downward. In addition, on the surface of the second substrate 6, an IC substrate (signal processing section) 4a for transmitting the electric signal to the light-emitting element 12a is mounted.

In this single channel optical module, a vertical cavity surface emitting laser (VCSEL) as a semiconductor laser is used as the light-emitting element 12a. An LED or the like may also be used as the light-emitting element 12a.

The IC substrate 4a is a driver IC that drives the VCSEL, and is disposed in the vicinity of the light-emitting element 12a. The light-emitting element 12a and the IC substrate 4a are connected to a metal circuit (a patterning circuit by copper or gold sputtering) and a gold wire formed on the surface of the first substrate 1.

As shown in FIG. 3A, a first trench (waveguide formation trench) 1a in a substantially trapezoidal shape and a second trench 1b in a substantially V shape that is deeper than the first trench 1a are continuously formed in the surface of the first substrate 1 in a front and rear direction.

At the tip portion of the first trench 1a, a mirror section 15 for changing an optical path that bends the optical path by 90 degrees is formed at a position immediately below the light-emitting element 12a.

As shown in FIG. 3B, in the first trench 1a of the first substrate 1, there is provided the internal waveguide 16 that is optically coupled to the light-emitting element 12a of the first substrate 1. The internal waveguide 16 extends from the mirror section 15 in the direction of the second trench 1b, and the end surface of the internal waveguide 16 is flush with a rear end portion 1d of the first trench 1a or slightly recessed toward the mirror section 15.

The internal waveguide 16 is constituted by a core section 17 having a substantially square cross section that has a high refractive index of light propagation, and a cladding section 18 having a refractive index lower than that of the core section 17. As shown in FIG. 2C, both right and left surfaces of the core section 17 are covered with the cladding section 18. The upper surface of the core section 17 is also thinly covered with the cladding section 18 though not shown in the drawing.

As shown in FIG. 4A, at a predetermined position on the surface of the first substrate 1 on which the internal waveguide 16 is provided, the light-emitting element 12a is mounted. As shown in FIG. 2A, a space between the light-emitting element 12a and the core section 17 is filled with an adhesive optically transparent resin (under-fill material) 13.

Herein, a description will be given of a production method of the optical module on the light-emitting side. Note that, since it is possible to produce the optical module on the light-emitting side and the optical module on the light-receiving side separately and the production methods thereof are the same, only the production method of the optical module on the light-emitting side will be described.

A plurality of the mount substrates 1 are formed at the same time by using a silicon wafer (silicon substrate), the silicon wafer is finally cut, and the mount substrates 1 shown in FIG. 3 are individually separated from the silicon wafer. As the silicon wafer, for etching performed at the subsequent step, the silicon wafer of which the crystal orientation is selected is prepared.

Next, in the silicon wafer, the first trench (waveguide formation trench) 1a and a surface inclined by 45° for forming the mirror section 15 are formed. They are formed by anisotropic etching that uses a difference in the etching rate of a silicon crystal. The 45°-inclined surface is formed by adjusting the shape of an etching mask and etchant concentration and composition. In addition to the anisotropic etching, the formation method of the first trench 1a includes a formation method of dry etching such as reactive ion etching or the like.

When the first trench 1a is formed at the same time as the 45°-inclined surface, the shape of the cross section of the first trench 1a becomes substantially trapezoidal, and the width of the first trench 1a is increased. No problem arises if the first trench 1a does not contact a bonding pad for the light-emitting element 12a formed in the next step, and hence the first trench 1a may have the increased width as described above.

Although the second trench 1b can be formed by the anisotropic etching, the second trench 1b may be formed concurrently with the formation of the first trench 1a, or may be formed separately from the first trench 1a.

A wiring pattern (not shown) for mounting the light-emitting element 12a is formed on the silicon wafer. The wiring is performed by depositing gold on the silicon wafer and patterning the gold. At this point, the gold is also deposited on the 45°-inclined surface and the mirror section 15 is thereby formed. Note that, although depending on a wavelength to be used, it is also possible to use the 45°-inclined surface as the mirror section 15 without depositing the gold, but reflectance and optical coupling efficiency are increased by depositing the gold on the 45°-inclined surface in a case where, e.g., a light source of near infrared rays is used. Note that, as the wiring material other than gold, there are cases where a multilayer structure of titanium, nickel, gold, and aluminum, or chromium, nickel, and gold is formed on the mount substrate from the viewpoint of easiness and connection reliability in soldering process in the subsequent step. Examples of the thickness when the multilayer structure is formed include 0.5 μm, 1 μm, and 0.2 μm.

Next, as shown in FIGS. 3A and 3B, the internal waveguide 16 is formed in the first trench 1a. First, a core material is applied onto the first substrate 1, and the core material is made even on the first substrate 1 so as to be flat by using a flat mold. Thereafter, only the core portion is irradiated with ultraviolet rays using a mask, the core section is thereby cured, and an unnecessary portion other than the core section is developed and removed. Subsequently, a cladding material having the refractive index lower than that of the core material is applied to the first trench 1a formed with the core section, and is made even on the first substrate 1 similarly to the core material. With the cladding material being flat, the cladding material is blocked using the mask such that the portion of the first trench 1a is irradiated with ultra violet rays, and the cladding material is thereby cured. The mask is adjusted such that only a region covering the outer peripheral portion of the core section is cured, and is designed such that the cladding material does not cover a circuit in a portion where the light-emitting element 12a is amounted.

Subsequently, as shown in FIGS. 4A and 4B, the light-emitting element 12a is mounted on the silicon wafer. A bump is formed at the light-emitting element 12a by stud bump bonding, the silicon wafer and the light-emitting element 12a are heated to 200° C., and ultrasonic bonding thereof is performed.

Note that, although not shown in the drawing, after the light-emitting element 12a is mounted, the space between the light-emitting element 12a and the first substrate 1 is filled with the under-fill material, and the bonding strength between the light-emitting element 12a and the first substrate 1 is reinforced. The under-fill material also has the effect of eliminating an air layer between the optical element and the internal waveguide and enhancing the optical coupling efficiency. In addition, in order to improve an environmental resistance, the entire substrate may also be sealed with an elastic sealing material.

Then, as shown in FIG. 1, the first substrate 1 on which the light-emitting element 12a is mounted is mounted on the surface (upper surface) of the second substrate 6, the IC substrate 4a is also mounted thereon, and the connector 7 is attached to the lower surface of the second substrate 6.

As described above, in the first embodiment, the light-emitting element 12a is mounted on the upper surface of the first substrate 1 mounted on the upper surface of the second substrate 6, the IC substrate 4a is mounted on the upper surface of the second substrate 6, and the connector 7 is mounted on the lower surface thereof.

With this, it becomes easy to inspect the IC substrate 4a of the first substrate 6 and the light-emitting element 12a of the first substrate 1 individually before the first substrate 1 is mounted on the upper surface of the second substrate 6.

In addition, even when one of the light-emitting element 12a and the IC substrate 4a is faulty, only one of the second substrate 6 and the first substrate 1 becomes faulty, and hence the loss of the entire substrate can be avoided.

Further, the light-emitting element 12a is mounted on the first substrate 1 instead of the second substrate 6 on which the IC substrate 4a is mounted, and the mirror section 15 and the internal waveguide 16 are formed on the first substrate 1. With this, a thermal influence from the IC substrate 4a is made less likely to be exerted on the light-emitting element 12a, and light emission characteristics are stabilized.

Returning to FIG. 1, the first substrate 3 on the light-receiving side will be described. The basic configuration of the first substrate 3 on the light-receiving side is similar to that of the first substrate 1 on the light-emitting side. However, the first substrate 3 on the light-receiving side is different from the first substrate 1 on the light-emitting side in that the light-receiving element 12b that converts the optical signal to the electric signal is flip-chip mounted on the surface (upper surface) of the first substrate 3 on the light-receiving side using the bump with the light-receiving surface faced downward. In addition, the second substrate 6 on the light-receiving side is different from the second substrate 6 on the light-emitting side in that an IC substrate (signal processing section) 4b that receives the electric signal from the light-receiving element 12b is mounted on the surface of the second substrate 6 on the light-receiving side. As the light-receiving element 12b, a PD (Photo Diode) is used, and the IC substrate 4b is an element such as a TIA (Trans-Impedance Amplifier) that performs the conversion of current and voltage or the like.

The first substrate 1 on the light-emitting side, the first substrate 3 on the light-receiving side, and the IC substrates 4a and 4b are shielded by shield cases 8 attached to the surfaces of the second substrates 6. The optical fiber 2 is extended through holes 8a of the shield cases 8.

Next, the configuration of the optical fiber (external waveguide) 2 will be described. As shown in FIGS. 1 and 5, the optical fiber 2 includes a fiber core section 21 that can optically couple the core section 17 of the internal waveguide 16 of the first substrate 1 on the light-emitting side and the core section 17 of the internal waveguide 16 of the first substrate 3 on the light-receiving side. The optical fiber 2 is a cord type optical fiber constituted by a fiber cladding section 22 that surrounds the outer periphery of the fiber core section 21 and a sheathing section 23 with which the outer periphery of the fiber cladding section 22 is sheathed. The fiber core section 21, the fiber cladding section 22, and the sheathing section 23 are concentrically disposed, and the optical fiber 2 constituted by these has a circular cross section.

With this structure, the optical fiber 2 functions as the external waveguide that transmits light outside the first substrate 1.

As shown in FIG. 1, the optical fiber 2 is extended through the through holes 8a of the shield cases 8. The sheathing section 23 is peeled at a position just before the second trench 1b of the first substrate 1, and the fiber cladding section 22 is exposed.

As shown in FIGS. 2A, 2C and 4B, the fiber cladding section 22 of the optical fiber 2 is disposed in the second trench 1b of the first substrate 1. The fiber cladding section 22 is positioned by a rising inclined portion 10d (see FIG. 2A) at the boundary portion with the first trench 1a. At this point, the optical coupling is established in a positioning state where the optical axis of the core section 17 of the internal waveguide 16 of the first substrate 1 and the optical axis of the fiber core section 21 of the optical fiber 2 match with each other.

A gap between the end surface of the core section 17 of the internal waveguide 16 of the first substrate 1 and the end surface of the fiber core section 21 of the optical fiber 2 is in a range of 0 to 200 μm. Although the preferably range depends on the size of each of the core sections 17 and 21, the gap is preferably 0 to 60 μm in general.

At the position on the surface of the first substrate 1, as shown in FIGS. 2A and 5, a holding block 24 is disposed on the upper portion of the fiber cladding section 22 of the optical fiber 2. A space between the holding block 24 and the second trench 1b is filled with an adhesive 14.

Thus, the portion on the tip side of the fiber cladding section 22 of the optical fiber 2 is held down onto the second trench 1b by the holding block 24. The portion on the tip side is bonded and fixed to the first substrate 1 together with the holding block 24 with the adhesive 14.

In the optical module configured in the manner described above, the internal waveguide 16 constituted by the core section 17 and the cladding section 18 is provided in the first trench 1a of the first substrate 1. The fiber core section 21 of the optical fiber 2 disposed in the second trench 1b of the first substrate 1 is optically connected to the core section 17 of the internal waveguide 16. In the first substrate 1 on the light-emitting side having the light-emitting element 12a as the optical element, the optical signal is emitted to the core section 17 of the internal waveguide 16 via the mirror section 15 and, in the first substrate 3 on the light-receiving side having the light-receiving element 12b as the optical element, the optical signal from the core section 17 of the internal waveguide 16 is received via the mirror section 15.

Thus, since the internal waveguide 16 is interposed between the tip of the fiber core section 21 of the optical fiber 2 and the mirror section 15, a luminous flux emitted from the light-emitting element 12a does not spread, and the luminous flux emitted from the fiber core section 21 of the optical fiber 2 does not spread. Consequently, the propagation loss of the optical signal between the tip of the fiber core section 21 of the optical fiber 2 and the mirror section 15 is almost eliminated, and hence the optical coupling efficiency is improved.

Figure 15:
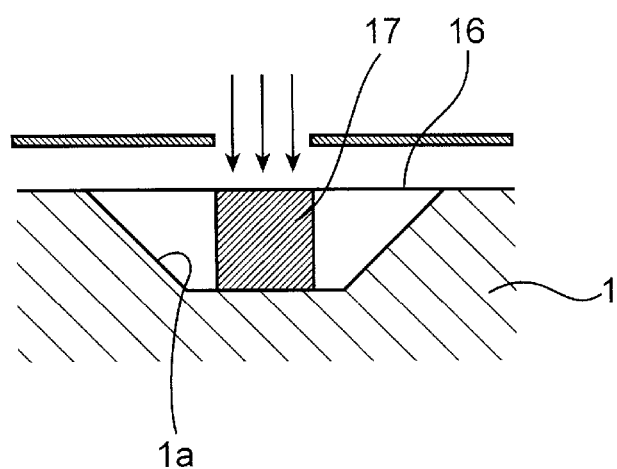
[FIG. 15]

In addition, similarly to the optical module of a second embodiment described later, when the bottom surface of the first trench 1a is made wider than the core section 17 of the internal waveguide 16, as shown in FIG. 15, when the core section 17 of the internal waveguide 16 is subjected to patterning (photo-cured) during the formation of the core section 17, unnecessary reflection on the bottom surface is prevented. Consequently, in this case, it is possible to obtain a high-accuracy core shape.

Next, a description will be given of the multi-channel optical module according to the first embodiment of the present invention with reference to FIGS. 6 and 7.

Figure 6A:
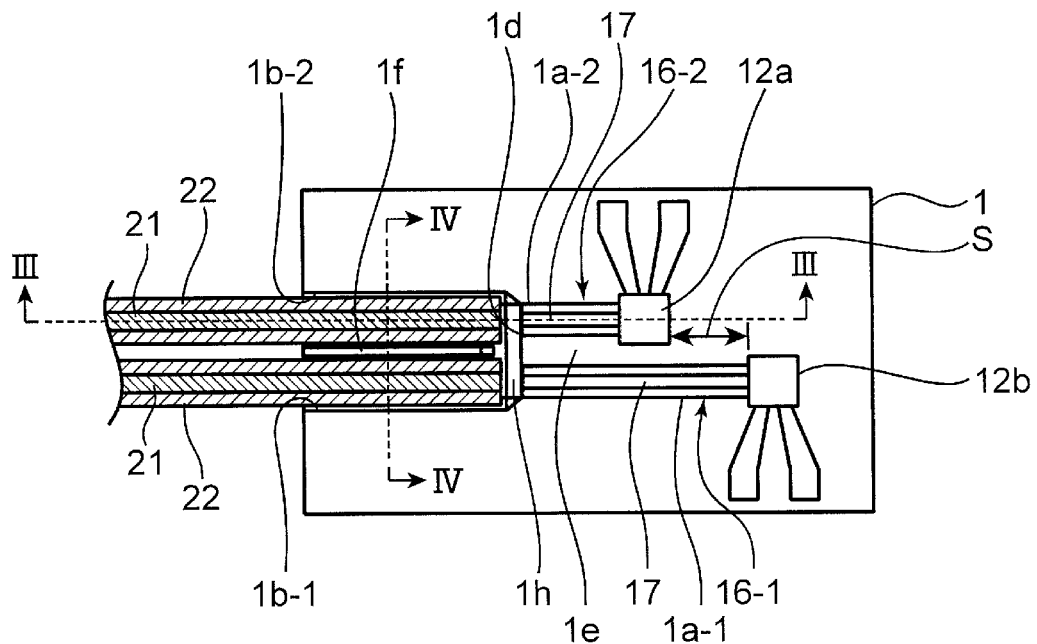
FIG. 6A is a plan view of a multi-channel optical module according to a first embodiment of the present invention.
Figure 6B:
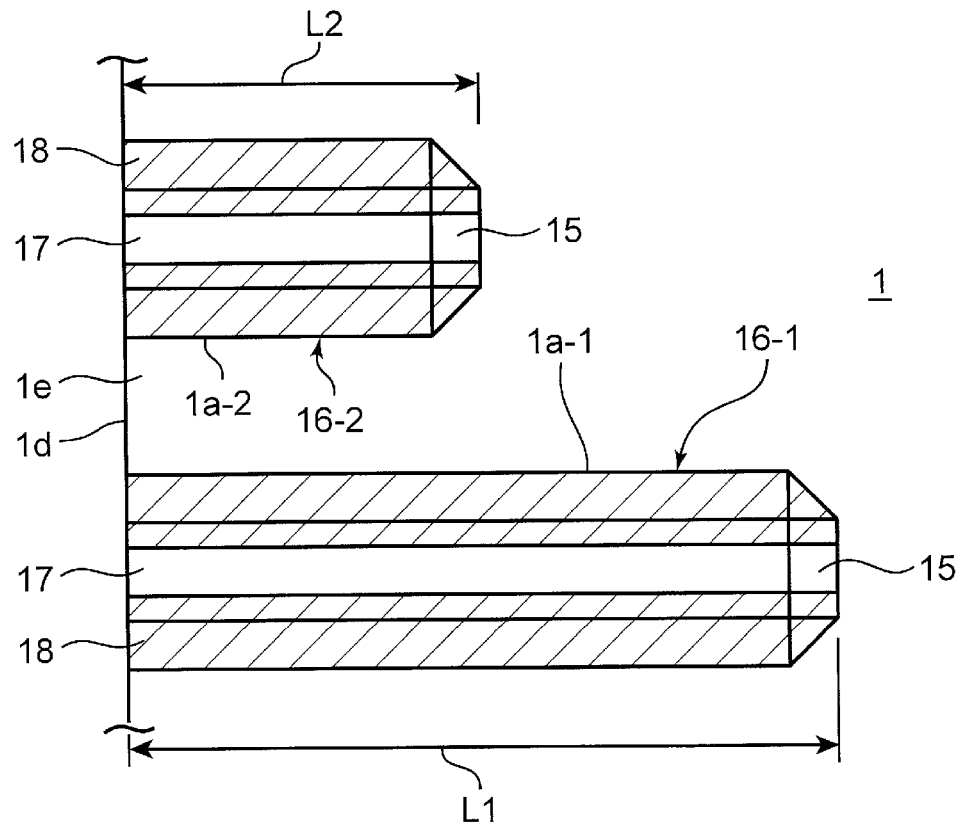
FIG. 6B is an enlarged plan view of a first trench and the internal waveguide.
Figure 7A:
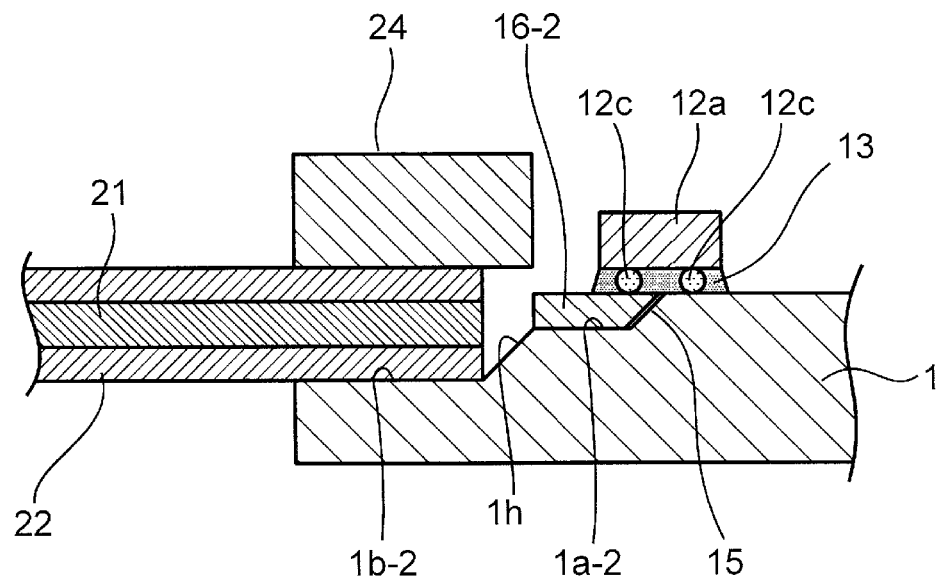
FIG. 7A is an III-III line enlarged cross-sectional view of FIG. 6A.
Figure 7B:
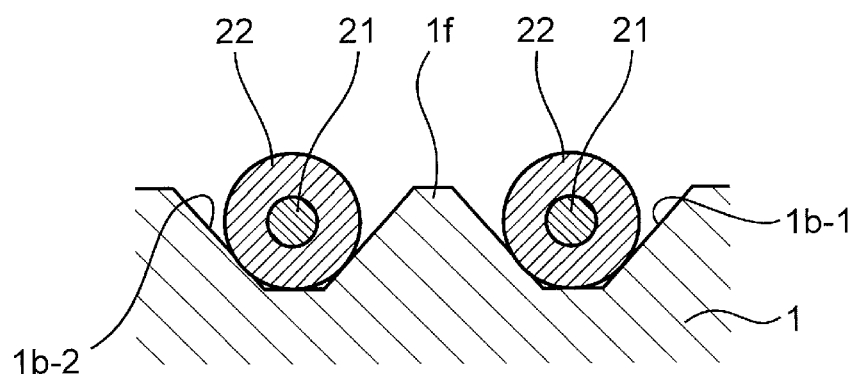
FIG. 7B is an IV-IV line enlarged cross-sectional view of FIG. 6A.

FIG. 6A is a plan view of the first substrate 1, and FIG. 6B is an enlarged plan view of first trenches 1a-1 and 1a-2 and internal waveguides 16-1 and 16-2 of the first substrate 1. Note that, in FIG. 6B, in order to clarify the range of the cladding section 18, the cladding section 18 is hatched. FIG. 7A is a III-III line enlarged cross-sectional view of FIG. 6A, and FIG. 7B is a IV-IV line enlarged cross-sectional view of FIG. 6A.

The multi-channel optical module according to the first embodiment of the present invention shown in FIGS. 6 and 7 includes two single channel optical modules shown in FIGS. 1 to 5. Specifically, the multi-channel optical module is as follows.

On the surface of the first substrate 1, a plurality of (two in the example shown in each of FIGS. 6 and 7) the substantially trapezoidal first trenches 1a-1 and 1a-2 are formed independently of each other (i.e., in a state where they are separated or spaced from each other), i.e., a plurality of the adjacent first trenches 1a-1 and 1a-2 are formed substantially in parallel with each other in a state where they are separated from each other by a partition wall portion 1e.

The adjacent first trenches 1a-1 and 1a-2 have lengths L1 and L2 from the end surface of the first substrate 1 (the rear end portion 1d of the first trench 1a in the example shown in each of FIGS. 6 and 7) which are different from each other. Similarly to the foregoing, the internal waveguides 16-1 and 16-2 are provided in the first trenches 1a-1 and 1a-2, respectively.

The optical elements (the light-emitting element 12a and the light-receiving element 12b) are mounted on the surface of the first substrate 1 so as to oppose the mirror sections 15 formed at the tip portions of the first trenches 1a-1 and 1a-2 having different lengths. In the first embodiment, the mirror section disposed at the end portion of the long internal waveguide 16-1 having the length L1 opposes the light-receiving element 12b, and the mirror section 15 disposed at the end portion of the short internal waveguide 16-2 having the length L2 shorter than the length L1 opposes the light-emitting element 12a. Note that only the light-emitting elements 12a or only the light-receiving elements 12b can be disposed to oppose the mirror sections 15 formed at the tip portions of the internal waveguides 16-1 and 16-2. In addition, the number of formed first trenches 1a-1 and 1a-2 is not limited to two, and three or more trenches may also be formed. In this case, it is sufficient for three adjacent first trenches to have different lengths, and the lengths of the first and third first trenches may be equal to each other. In a case where four or more first trenches are formed, similarly, the first trenches that are not adjacent to each other may have the same length.

Two second trenches 1b-1 and 1b-2 are formed in the surface of the first substrate 1. Herein, each of the second trenches may be substantially trapezoidal or V-shaped as long as the second trench does not come in contact with the bottom surface of the optical fiber. The adjacent second trenches 1b-1 and 1b-2 are separated from each other by a partition wall portion 1f. The partition wall portion 1f is separated from the partition wall portion 1e between the first trenches 1a-1 and 1a-2 in an inclined portion 1h of the bottom surfaces of the second trenches 1b-1 and 1b-2 and the bottom surfaces of the first trenches 1a-1 and 1a-2.

As shown in FIG. 6A, the optical fiber (external waveguide) 2 has two parallel fiber core sections 21 (multi-channel) which can be optically coupled to the core sections 17 of the internal waveguides 16-1 and 16-2, and the outer periphery of each fiber core section 21 is surrounded by the fiber cladding section 22. Note that, instead of the optical fiber 2, it is also possible to use a multi-channel film-like flexible waveguide, i.e., a flexible waveguide film (external waveguide).

By fitting and fixing the fiber cladding sections 22 in and to the second trenches 1b-1 and 1b-2, the optical axes of the core sections 17 of the internal waveguides 16-1 and 16-2 and the optical axes of the fiber core sections 21 of the optical fiber 2 are set so as to match with each other.

In the configuration of the optical module described above, the lengths L1 and L2 of the adjacent first trenches 1a-1 and 1a-2 of the first substrate 1 are different from each other. In addition, the optical elements (the light-emitting element 12a and the light-receiving element 12b) are mounted on the surface of the first substrate 1 so as to oppose the mirror sections 15 at the tip portions of the first trenches 1a-1 and 1a-2 having the different lengths L1 and L2. With this, it is possible to secure a large distance (space) S between the adjacent optical elements (the light-emitting element 12a and the light-receiving element 12b) disposed at different positions in a length direction (see FIG. 6A).

Consequently, leaked light from the optical element, particularly from the light-emitting element 12a, or reflected scattered light from the mirror section 15 or the internal waveguide 16-2 becomes less likely to enter the adjacent optical element, particularly the mirror section 15 of the light-receiving element 12b and the internal waveguide 16-1. With this, even when the optical paths are formed at a small pitch, a cross-talk noise becomes less likely to occur.

In addition, since the internal waveguides 16-1 and 16-2 are provided in the plurality of (two in the present embodiment) the first trenches 1a-1 and 1a-2 formed independently of each other and substantially in parallel with each other, the internal waveguides 16-1 and 16-2 don't interfere with each other due to the partition wall portion 1e between the adjacent first trenches 1a-1 and 1a-2.

Thus, the plurality of the optical elements (the light-emitting element 12a and the light-receiving element 12b) are mounted on the first substrate 1 so as to be close to each other in the width direction of the first substrate 1, the internal waveguides 16-1 and 16-2 are formed at the small pitch so as to correspond to the interval of the optical elements (the light-emitting element 12a and the light-receiving element 12b), and the mirror sections 15 at the end portions of the internal waveguides 16-1 and 16-2 are formed at the small pitch. With this, it becomes possible to implement small in size, low in height, and bidirectional or multi-channel transmission.

Further, the adjacent optical elements (the light-emitting element 12a and the light-receiving element 12b) are separated by the large distance S, and the interference between the adjacent internal waveguides 16-1 and 16-2 is prevented by the partition wall portion 1e, whereby it becomes possible to significantly reduce the cross-talk noise.

In addition, as shown in FIG. 6A, in the case where both of the light-emitting element 12a and the light-receiving element 12b are included as the optical elements, the light-emitting element 12a is mounted on the surface of the first substrate 1 so as to oppose the mirror section 15 of the internal waveguide 16-2 having the length L2 shorter than the long internal waveguide 16-1 having the length L1 to which the light-receiving element 12b is optically coupled.

Thus, the light-emitting element 12a is disposed closer to the end surface of the first substrate 1 (the rear end portion 1d of the first trench 1a in the present embodiment) than the light-receiving element 12b. With this, the reflected scattered light of the mirror section 15 on the side of the light-emitting element 12a becomes less likely to affect the side of the light-receiving element 12b due to the orientation of the mirror section 15 on the side of the light-emitting element 12a. Consequently, even when both of the light-emitting element 12a and the light-receiving element 12b are mounted on the first substrate 1, it becomes possible to significantly reduce the cross-talk noise.

Further, the second trenches 1b-1 and 1b-2 extending from the first trenches 1a-1 and 1a-2 of the internal waveguides 16-1 and 16-2 are formed in the surface of the first substrate 1. The fiber cladding sections 22 of the optical fiber 2 are fitted in and fixed to the second trenches 1b-1 and 1b-2, whereby the optical axes of the core sections 17 of the internal waveguides 16-1 and 16-2 and the optical axes of the fiber core sections 21 of the optical fiber 2 match with each other. Consequently, by forming the first trenches 1a-1 and 1a-2 and the second trenches 1b-1 and 1b-2 in which the fiber cladding sections 22 of the optical fiber 2 are fitted in the first substrate 1, it becomes easy to optically couple the internal waveguides 16-1 and 16-2 and the optical fiber 2. As a result, it becomes possible to produce the high-accuracy optical module at low cost.

Further, in a case where the external waveguide is the multi-channel optical fiber 2, by matching the pitch of the internal waveguides 16-1 and 16-2 with the pitch of the commercial optical fiber 2, it becomes easy to perform optical assembly and it becomes possible to produce the optical module at low cost.

Moreover, in a case where the external waveguide is the multi-channel flexible waveguide film, by matching the pitch of the internal waveguides 16-1 and 16-2 with the pitch of the commercial flexible waveguide film, it becomes easy to perform the optical assembly and it becomes possible to produce the optical module at low cost.

Figure 8:
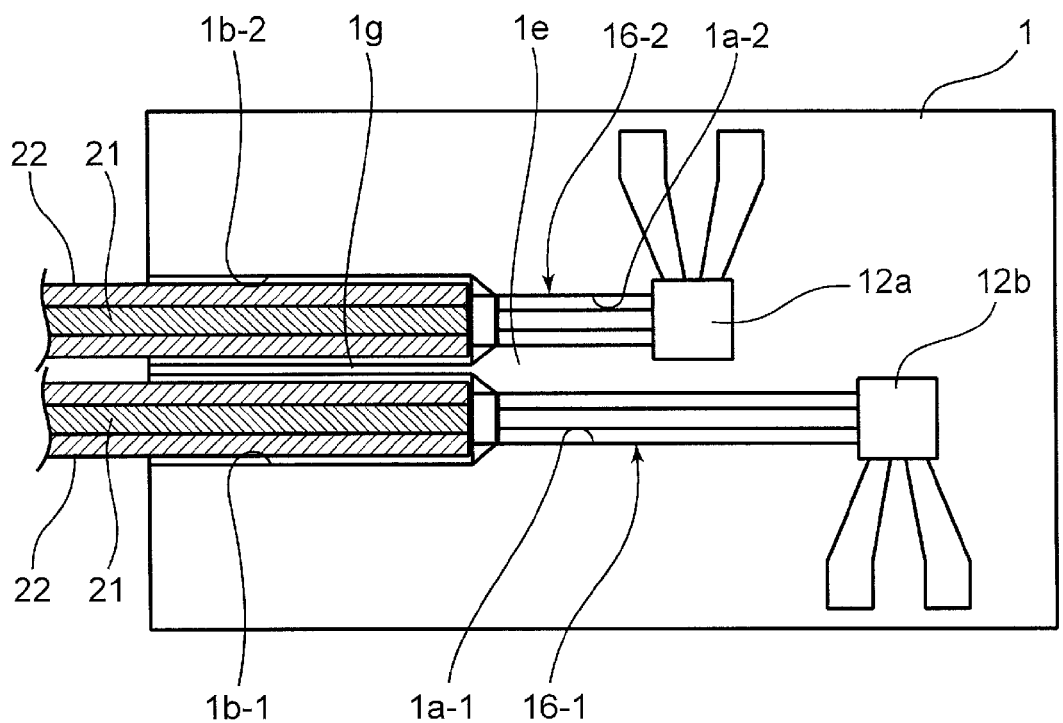
[FIG. 8]

Note that, as a modification of the first embodiment of the present invention, as shown in FIG. 8, a partition wall portion 1g between the adjacent second trenches 1b-1 and 1b-2 is formed so as not to be separated from the partition wall portion 1e between the adjacent first trenches 1a-1 and 1a-2. The second trenches 1b-1 and 1b-2 are formed independently of each other, and the partition wall portion 1g is thereby formed between the adjacent second trenches 1b-1 and 1b-2. According to the configuration, the leaked light does not interfere with the adjacent waveguides at an optical coupling portion of the internal waveguides 16-1 and 16-2 and the optical fiber 2, and hence it becomes possible to further reduce the cross-talk noise.

Figure 9A:
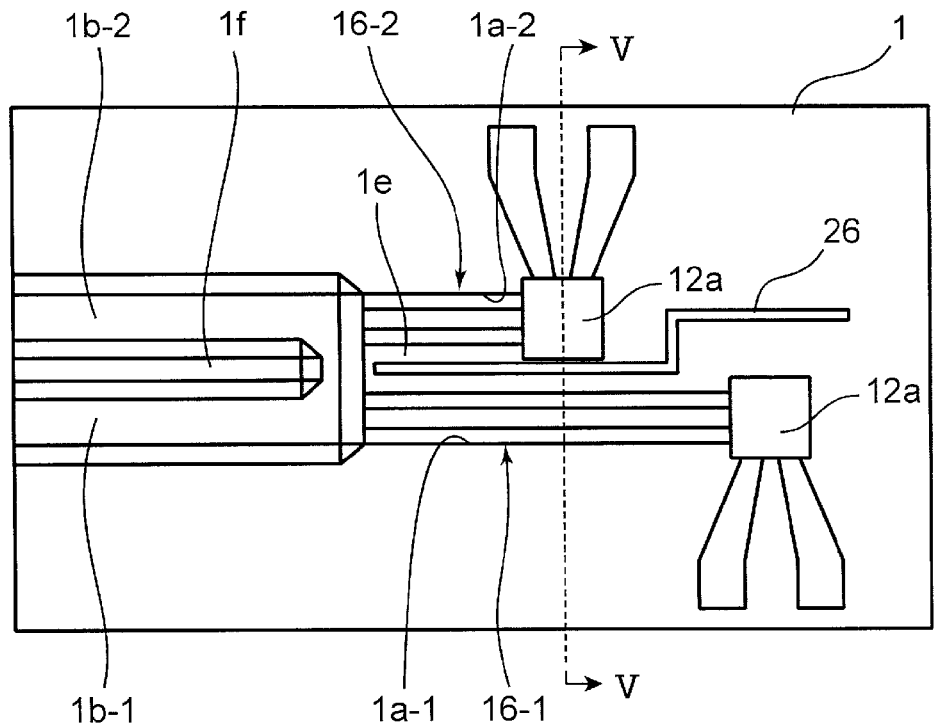
FIG. 9A is a plan view of the substrate and FIG. 9B is a V-V line enlarged cross-sectional view of FIG. 9A.
Figure 9B:
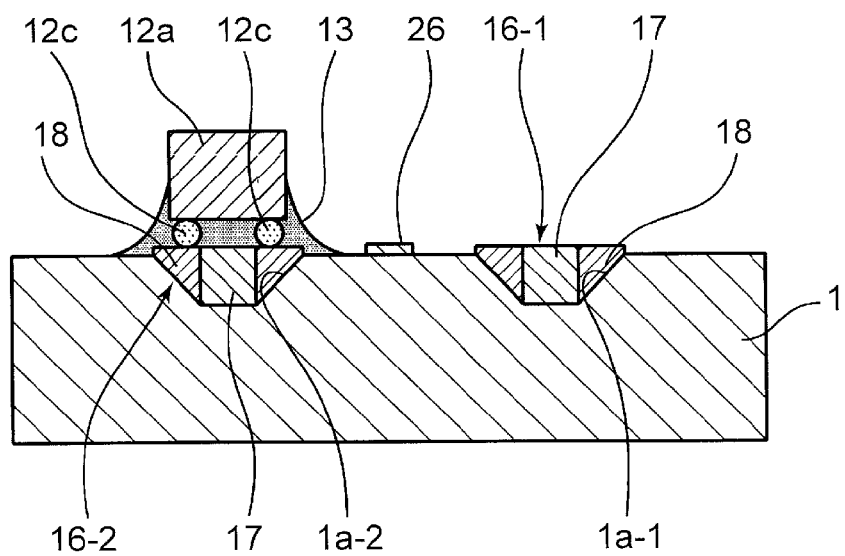
Figure 10:
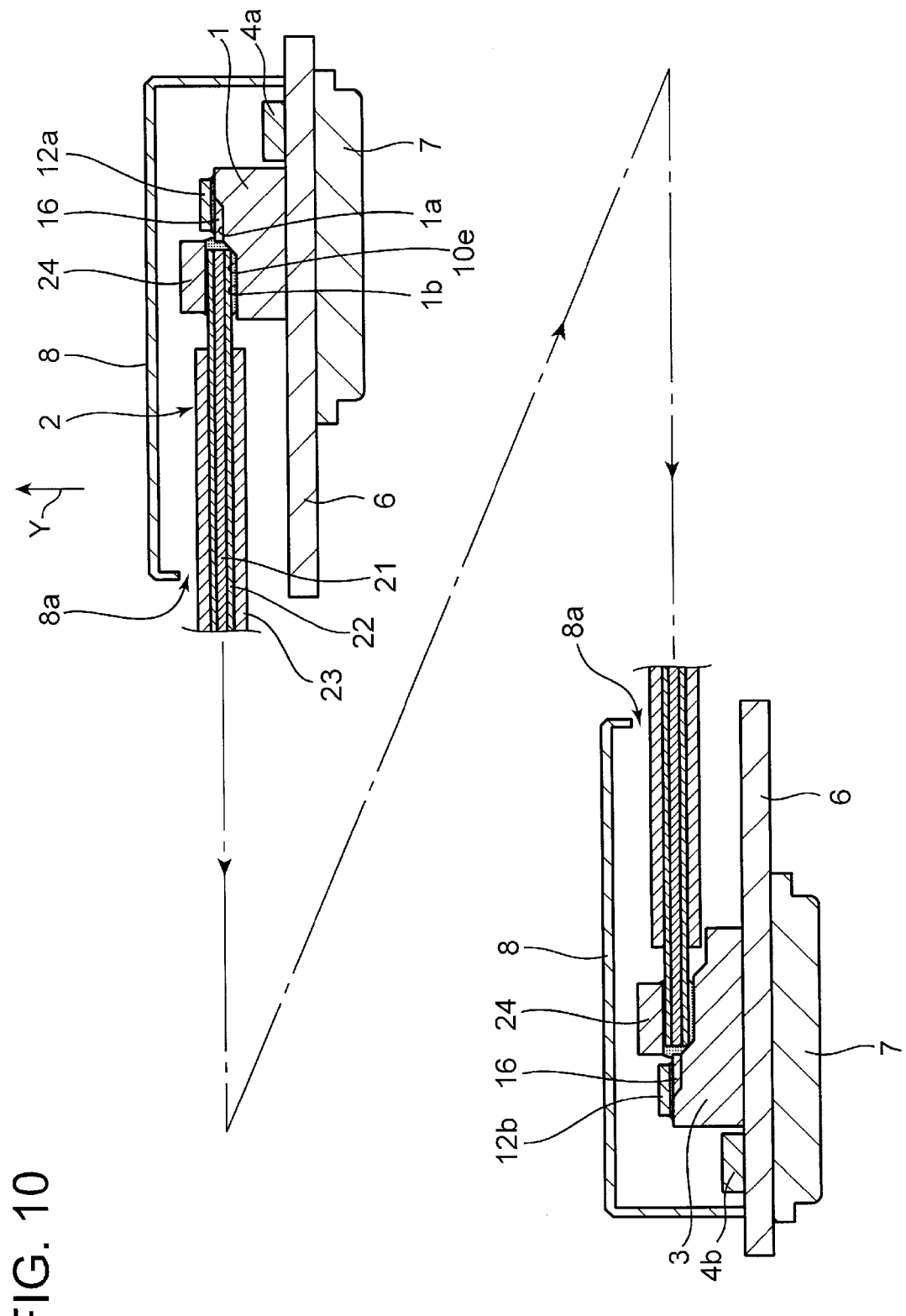
[FIG. 10]

In addition, each of FIGS. 9A and 9B shows another modification of the first embodiment of the present invention. FIG. 9A is a plan view of the substrate 1 of the modification, while FIG. 9B is a V-V line enlarged cross-sectional view of FIG. 9A. A convex layer 26 containing the same material as that of the cladding section 18 of the internal waveguide 16 is formed on the surface of the first substrate 1 between the light-emitting element 12a and the light-receiving element 12b.

In the configuration, by forming the convex layer 26 containing the same material as that of the cladding section 18 on the surface of the first substrate 1 between the light-emitting element 12a and the light-receiving element 12b, it is possible to trap the leaked light between the light-emitting element 12a and the light-receiving element 12b. Consequently, it is possible to further reduce the cross-talk noise. In addition, it is also possible to use the convex layer 26 as a stopper for preventing the under-fill material as the optically transparent resin 13 filled in the space between the light-emitting element 12a and the light-receiving element 12b and the surface of the first substrate 1 from flowing out. Although the material of the convex layer 26 is not limited to the material of the cladding section 18, when the material thereof is the same as the material of the cladding section 18, it is possible to form the convex layer 26 in the step of forming the cladding section 18 concurrently.

Additionally, when an absorber that absorbs light is used as the material of the convex layer 26 instead of the material of the cladding section 18, the leaked light between the light-emitting element 12a and the light-receiving element 12b can be absorbed, and hence it becomes possible to further reduce the cross-talk noise. Herein, an example of the absorber includes a colored resin, e.g., an opaque acrylic resin or an epoxy resin.

As described above, the optical module according to the first embodiment includes the substrate formed with the plurality of the first trenches in the surface, the internal waveguides that are provided in the plurality of the first trenches and have the core sections, the mirror sections for changing the optical path that are formed at the tip portions of the plurality of the first trenches, and the optical elements that are mounted on the surface of the substrate so as to oppose the mirror sections and that emits the optical signal to the core section of the internal waveguide via the mirror section or receives the optical signal from the core section of the internal waveguide via the mirror section, the plurality of the first trenches of the substrate are formed independently of each other and substantially in parallel with each other, and the lengths of the adjacent first trenches from the end surface of the substrate are different from each other. The optical elements are mounted on the surface of the substrate so as to oppose the mirror sections formed at the tip portions of the first trenches having different lengths.

According to the configuration, the lengths of the adjacent first trenches are made different from each other and the optical elements are mounted on the surface of the substrate so as to oppose the mirror sections at the tip portions of the first trenches having different lengths, whereby it is possible to secure the large distance between the adjacent optical elements disposed at different positions in the length direction, e.g., the unaligned adjacent optical elements.

Consequently, since the leaked light from the optical element or the reflected scattered light from the mirror section or the internal waveguide becomes less likely to enter the mirror section or the internal waveguide of the adjacent optical element, even when the optical paths are formed at the small pitch, the cross-talk noise becomes less likely to occur. In addition, since the internal waveguides are provided in the plurality of the first trenches formed independently of each other and substantially in parallel with each other, the internal waveguides don't interfere with each other due to the partition wall portion between the adjacent first trenches.

Thus, the plurality of the optical elements are mounted on the substrate so as to be close to each other in the width direction of the substrate, and the internal waveguides and the mirror sections are formed such that the pitch of the internal waveguides and the pitch of the mirror sections are reduced so as to correspond to the interval of the optical elements, whereby it becomes possible to implement the small in size, low in height, and bidirectional or multi-channel transmission. Further, by securing the large distance between the adjacent optical elements and preventing the interference between the adjacent internal waveguides, it becomes possible to significantly reduce the cross-talk noise.

A configuration can be adopted in which the plurality of the optical elements include both of the light-emitting element and the light-receiving element, and the light-emitting element is mounted on the surface of the substrate so as to oppose the mirror section formed at the tip portion of the internal waveguide shorter in length than the internal waveguide optically coupled to the light-receiving element.

According to the configuration, by disposing the light-emitting element closer to the end surface of the substrate than the light-receiving element, the reflected scattered light of the mirror section on the side of the light-emitting element becomes less likely to affect the side of the light-receiving element due to the orientation of the mirror section on the side of the light-emitting element. Consequently, even when both of the light-emitting element and the light-receiving element are mounted on the substrate, it becomes possible to significantly reduce the cross-talk noise.

A configuration can be adopted in which the optical module includes the external waveguide having the core section optically coupled to the core section of the internal waveguide, the second trench extending from the first trench of the internal waveguide is formed in the surface of the substrate, and the optical axis of the internal waveguide and the optical axis of the external waveguide are set so as to match with each other by fitting and fixing the external waveguide in and to the second trench.

According to the configuration, by forming the first trench and the second trench in which the external waveguide is fitted in the substrate, it becomes easy to optically couple the internal waveguide and the external waveguide, and it becomes possible to produce the high-accuracy optical module at low cost.

A configuration can be adopted in which the partition wall portion is formed between the adjacent second trenches so as not to be separated from the partition wall portion between the adjacent first trenches.

According to the configuration, since the leaked light does not interfere with the adjacent waveguides at the optical coupling portions of the internal waveguides and the external waveguides, it becomes possible to further reduce the cross-talk noise.

A configuration can be adopted in which the optical module includes the external waveguide having the core section optically coupled to the core section of the internal waveguide, and the external waveguide is the multi-channel optical fiber.

According to the configuration, by matching the pitch of the internal waveguide with the pitch of the commercial optical fiber, it becomes easy to perform the optical assembly and it becomes possible to produce the optical module at low cost.

A configuration can be adopted in which the optical module includes the external waveguide having the core section optically coupled to the core section of the internal waveguide, and the external waveguide is the multi-channel flexible waveguide film.

According to the configuration, by matching the pitch of the internal waveguide with the pitch of the commercial flexible waveguide film, it becomes easy to perform the optical assembly, and it becomes possible to produce the optical module at low cost.

A configuration can be adopted in which the convex layer containing the same material as that of the cladding section of the internal waveguide is formed on the surface of the substrate between the optical elements.

According to the configuration, since it is possible to trap the leaked light between the optical elements by forming the convex layer containing the same material as that of the cladding section that has a high refractive index on the surface of the substrate between the optical elements, it becomes possible to further reduce the cross-talk noise. In addition, it is also possible to use the convex layer as the stopper for preventing the under-fill material filled in the space between the optical elements and the substrate from flowing out.

A configuration can be adopted in which the convex layer is the absorber that absorbs light.

According to the configuration, since it is possible to absorb the leaked light between the optical elements by forming the absorber on the surface of the substrate between the optical elements, it becomes possible to further reduce the cross-talk noise.

A configuration can be adopted in which the plurality of the second trenches each having the substantially V-shaped cross section that are deeper than the plurality of the first trenches are formed in the surface of the substrate continuously from the first trenches, and the external waveguide includes the optical fiber having the fiber cladding sections disposed in the second trenches and the fiber core sections as the core sections of the external waveguide.

According to the configuration, the plurality of the second trenches each having the substantially V-shaped cross section that are deeper than the plurality of the first trenches are formed in the surface of the substrate continuously from the first trenches, and the fiber core section of the optical fiber disposed in the second trench of the substrate is optically coupled to the core section of the internal waveguide. In a case where the optical element is the light-emitting element, the optical signal is emitted to the core section of the internal waveguide via the mirror section and, in a case where the optical element is the light-receiving element, the optical signal from the core section of the internal waveguide is received via the mirror section. Thus, since the internal waveguide is interposed between the tip of the fiber core section of the optical fiber and the mirror section, the luminous flux emitted from the light-emitting element does not spread, and the luminous flux emitted from the fiber core section of the optical fiber does not spread. Consequently, since the propagation loss of the optical signal between the tip of the fiber core section of the optical fiber and the mirror section is almost eliminated, the optical coupling efficiency is improved.

(Second Embodiment)

In the first embodiment, although the example in which the second trench having the V-shaped cross section in which the optical fiber 2 functioning as the external waveguide is fitted is formed is described, the present invention is not limited thereto and, as in a second embodiment shown below, a structure may also be adopted in which the second trench having a trapezoidal cross section, i.e., the second trench in a shape having a bottom surface having a predetermined width and two inclined surfaces on both ends of the bottom surface is provided.

Herein, in order to describe, in detail, the structure of the optical module of each channel included in the multi-channel optical module (see FIGS. 23A and 23B) according to the second embodiment of the present invention, first, a description will be given by using the single channel optical module in FIGS. 10 to 22 as an example of a simplified structure.

Note that the configuration of the single channel optical module shown in FIGS. 10 to 14 as the second embodiment is different from the configuration of the optical module having the second trench 1b having the V-shaped cross section shown in FIGS. 1 to 5 as the first embodiment in having the second trench 1b having the trapezoidal cross section, and is otherwise the same as the optical module as the first embodiment so that the description of portions which are the same as those of the optical module as the first embodiment will be omitted.

Figure 11A:
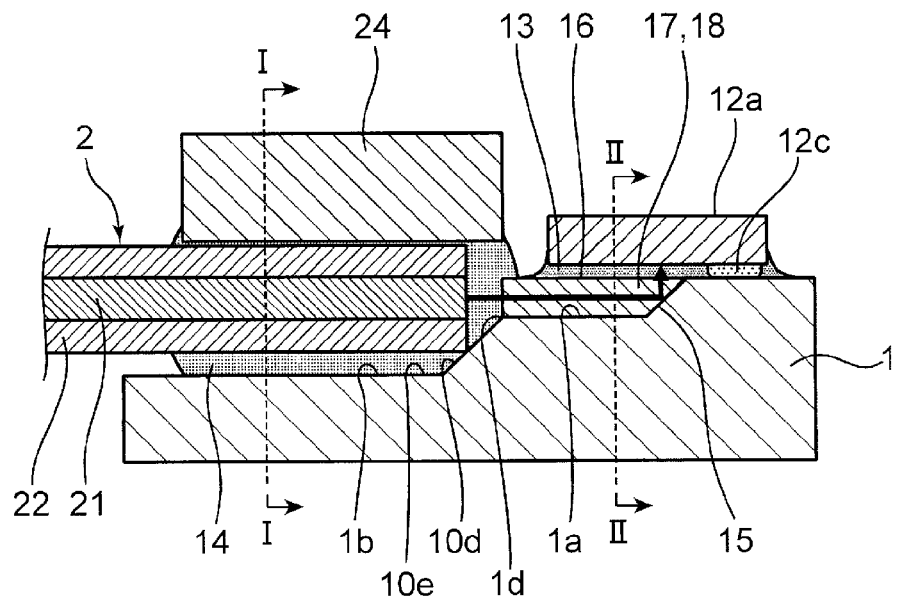
FIG. 11A is a side cross-sectional view.
Figure 11B:
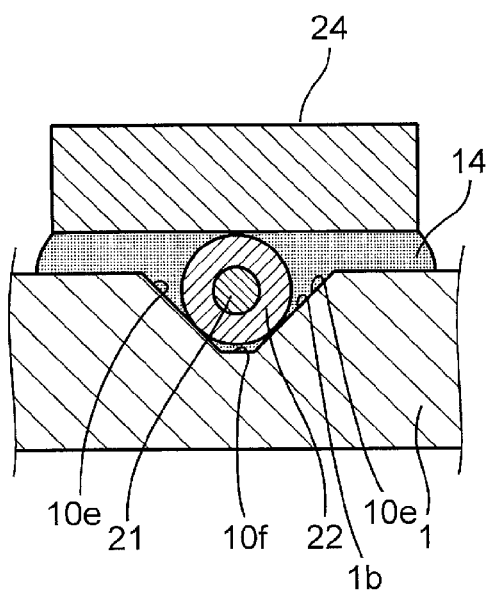
FIG. 11B is an I-I line cross-sectional view of FIG. 11A.
Figure 11C:
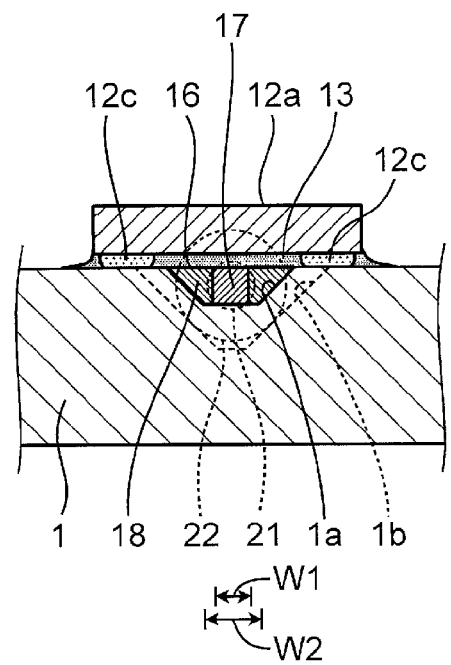
FIG. 11C is an II-II line cross-sectional view of FIG. 11A.
Figure 12A:
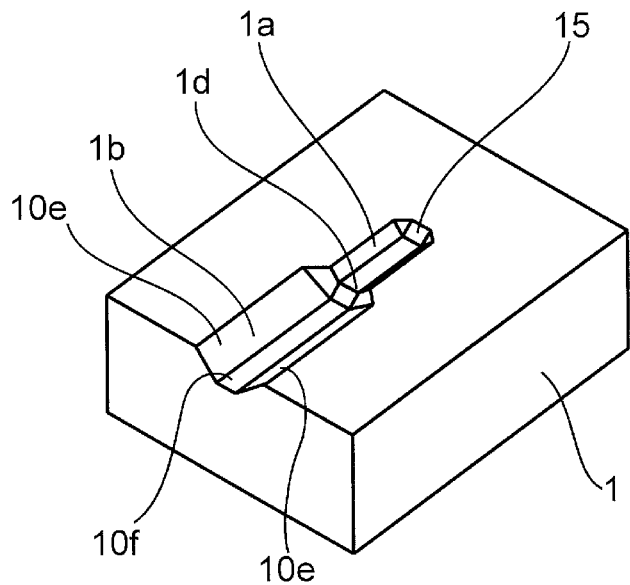
FIG. 12A is a perspective view of the first substrate of FIG. 10.

As shown in FIGS. 10 to 14, in the optical module according to the second embodiment, the first trench (waveguide formation trench) 1a having a substantially trapezoidal cross section and the second trench 1b in a substantially trapezoidal shape that is deeper than the first trench 1a are formed in the surface (upper surface) of the first substrate 1 continuously in the front and rear direction, as shown in FIG. 12A.

Figure 12B:
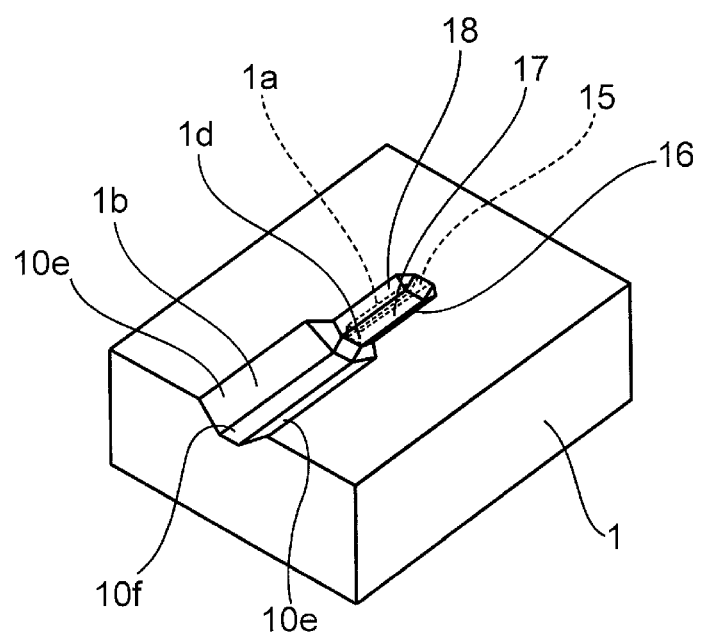
FIG. 12B is a perspective view of the first substrate of FIG. 10 formed with the internal waveguide.
Figure 13A:
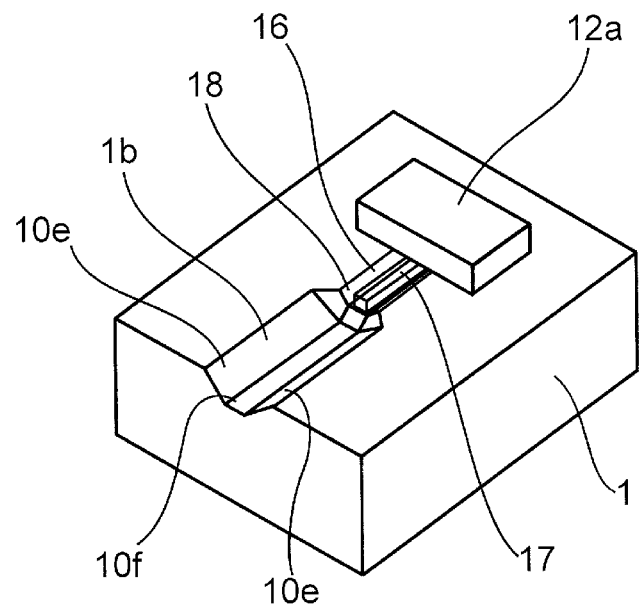
FIG. 13A is a perspective view of the first substrate of FIG. 10 on which the light-emitting element is mounted.
Figure 13B:
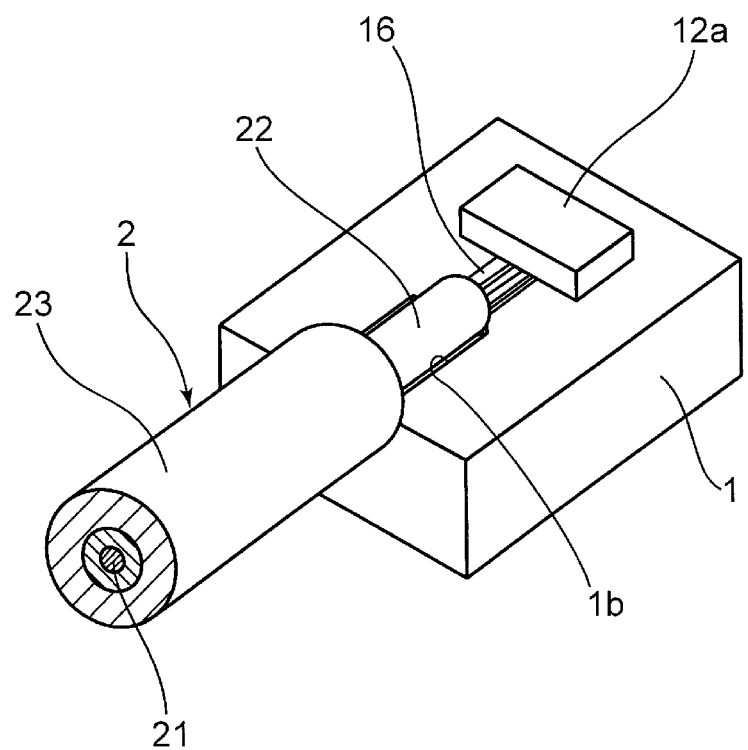
FIG. 13B is a perspective view of the first substrate of FIG. 10 into which the optical fiber is inserted.
Figure 14A:
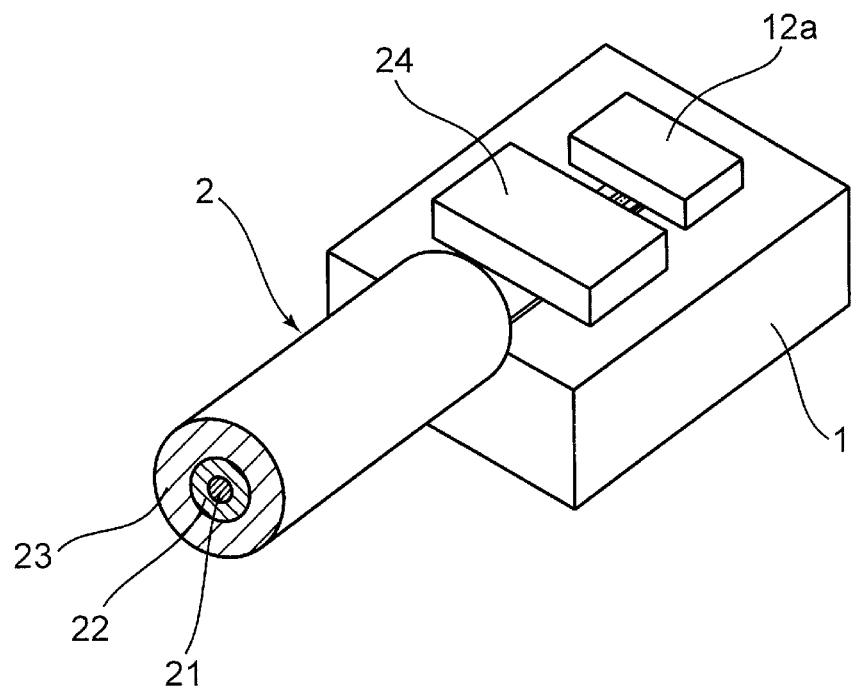
FIG. 14A is a perspective view of the first substrate of FIG. 10 to which the holding block is fixed.
Figure 14B:
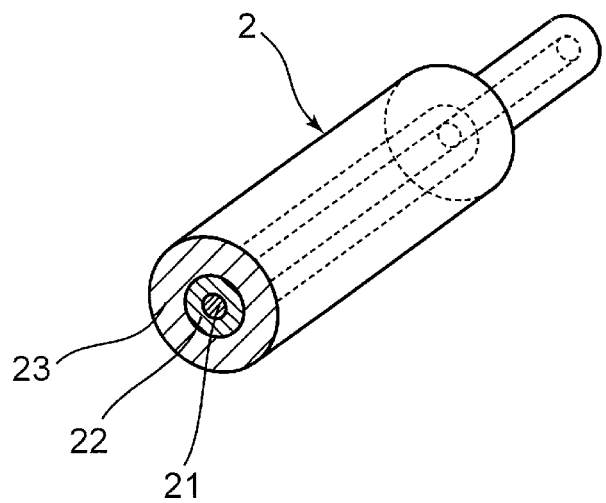
FIG. 14B is a perspective view of the optical fiber of FIG. 10.

As shown in FIG. 11B and FIGS. 12A and 12B, the second trench 1b includes a bottom surface 10f formed to have a predetermined width and two inclined surfaces 10e that come in contact with the outer periphery of the fiber cladding section 22 of the optical fiber 2 described later to support the optical fiber 2. The inclined surfaces 10e are connected to both ends of the bottom surface 10f in the width direction and are extended from the both ends to the surface (i.e., the upper surface) of the first substrate 1 obliquely upward such that the distance between the inclined surfaces 10e is gradually increased as it goes upward. The outer periphery of the fiber cladding section 22 of the optical fiber 2 comes in contact with the inclined surfaces 10e, and it is thereby possible to perform centering of the fiber cladding section 22.

In addition, the bottom surface 10f is formed so as not to be in contacted with the outer periphery of the fiber cladding section 22 when the inclined surfaces 10e and the outer periphery of the fiber cladding section 22 of the optical fiber 2 come in contact with each other.

Similarly to the optical module of the first embodiment, in the optical module of the second embodiment as well, the internal waveguide 16 constituted by the core section 17 and the cladding section 18 is provided in the first trench 1a of the first substrate 1. In addition, the fiber core section 21 of the optical fiber 2 disposed in the second trench 1b of the first substrate 1 is optically connected to the core section 17 of the internal waveguide 16. In the first substrate 1 on the light-emitting side having the light-emitting element 12a as the optical element, the optical signal is emitted to the core section 17 of the internal waveguide 16 via the mirror section 15, while in the first substrate 3 on the light-receiving side having the light-receiving element 12b as the optical element, the optical signal from the core section 17 of the internal waveguide 16 is received via the mirror section 15.

Thus, since the internal waveguide 16 is interposed between the tip of the fiber core section 21 of the optical fiber 2 and the mirror section 15, the luminous flux emitted from the light-emitting element 12a does not spread, and the luminous flux emitted from the fiber core section 21 of the optical fiber 2 does not spread. Consequently, since the propagation loss of the optical signal between the tip of the fiber core section 21 of the optical fiber 2 and the mirror section 15 is almost eliminated, the optical coupling efficiency is improved.

In addition, as shown in FIG. 15, in a case where the bottom surface of the first trench 1a is formed to have the width wider than that of the core section 17 of the internal waveguide 16, when the core section 17 of the internal waveguide 16 is subjected to patterning (photo-cured) during the formation of the core section 17, the unnecessary reflection on the bottom surface is prevented. Consequently, in this case, in is possible to obtain the high-accuracy core shape.

In the internal waveguide 16 of the second embodiment shown in FIGS. 10 to 15, the first trench 1a as the waveguide formation trench of the first substrate 1 has the substantially trapezoidal cross section, the core section 17 has a substantially square cross section, and both left and right surfaces of the core sections 17 are covered with the cladding section 18.

However, the internal waveguide 16 is not limited to the waveguide of this type. For example, like the internal waveguide 16 shown in FIGS. 16A and 16B, the first trench 1a of the first substrate 1 may be formed to be shallower than the second trench 1b and have the substantially V-shaped cross section, the core section 17 may be formed to have a substantially pentagonal cross section matching the first trench 1a, and both of the left and right surfaces of the core section 17 may be covered with the cladding section 18. For example, the core section 17 may be appropriately formed to have the substantially pentagonal cross section so as to have an upper surface, a pair of parallel side surfaces, and a V-shaped lower surface.

Figure 17:
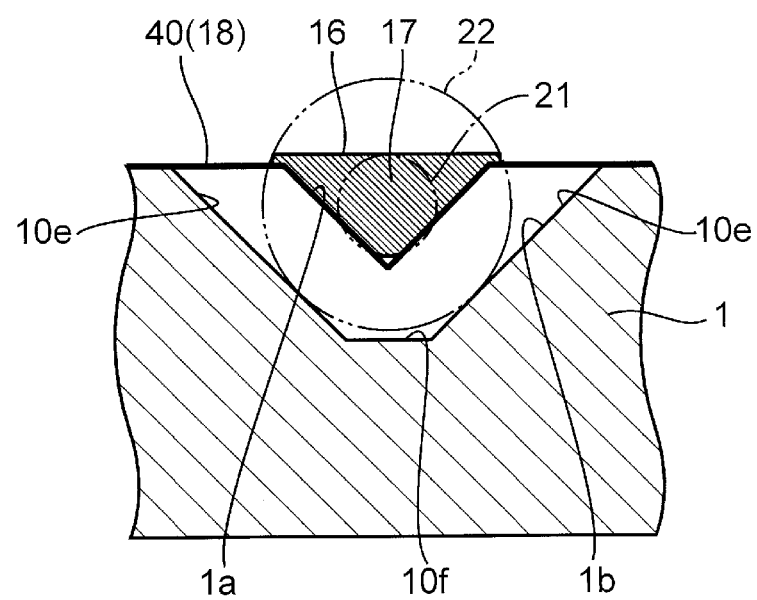
[FIG. 17]

In addition, like the internal waveguide 16 shown in FIG. 17, in a case where a silicon oxide film 40 for insulation is formed not only on the surface of the first substrate 1 but also on the surface in the first trench 1a, the silicon oxide film 40 functions as the cladding section 18 having the refractive index lower than that of the core section 17. Consequently, by filling the entire space in the first trench 1a formed with the silicon oxide film 40 functioning as the cladding section 18 with a core resin, the core section 17 having a substantially inverted triangular cross section may also be formed.

In the internal waveguide 16 shown in FIG. 17, the core section 17 occupies the entire space in the first trench 1a, and hence the luminous flux from the light-emitting element 12a spreads in the core section 17 in the width direction, and a part of the luminous flux may not reach the fiber core section 21 of the optical fiber 2.

Figure 16A:
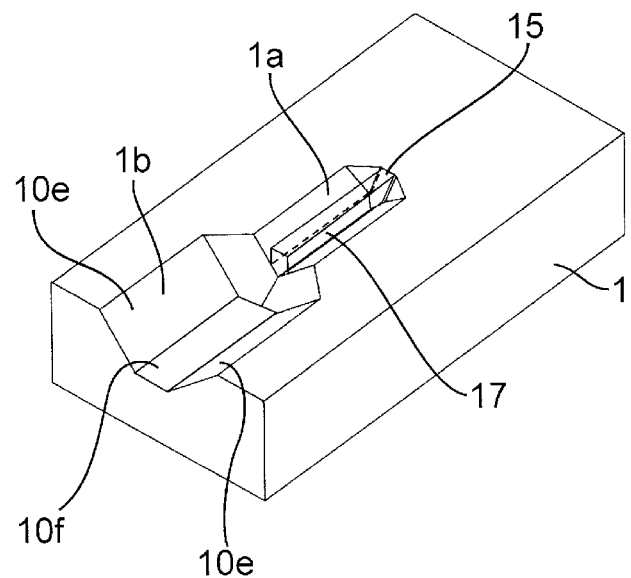
FIG. 16A is a perspective view of the first substrate.
Figure 16B:
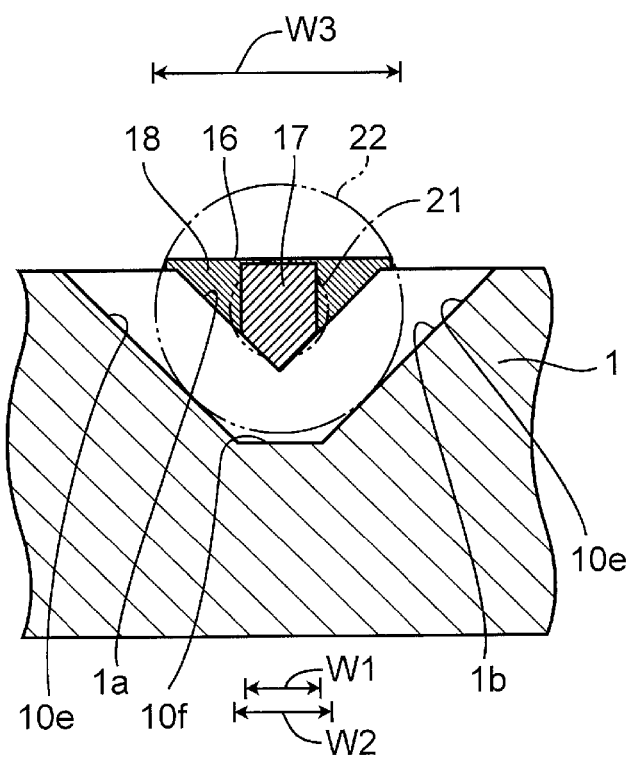
FIG. 16B is a front cross-sectional view of the first substrate.

To cope with this, as shown in FIG. 16B, by setting a width W1 of the core section 17 to substantially the same width as a width W2 of the fiber core section 21, almost all of the luminous flux can reach the fiber core section 21 of the optical fiber 2 and, as a result, the optical coupling efficiency is improved. Note that it is not always necessary to set the width W1 of the core section 17 to substantially the same width as the width W2 of the fiber core section 21, and it is only necessary for the width W1 of the core section 17 to be smaller than a width W3 of the upper end of the first trench 1a. The same applies to the core section 17 having the substantially square cross section, as shown in FIG. 11C.

In the first substrate 1 on the light-emitting side having the light-emitting element 12a as the optical element, as shown in FIGS. 19A and 19B, the core section 17 of the internal waveguide 16 can be formed into the shape of an inclined surface such that the width W of the core section 17 (the distance between both side surfaces 17a) is gradually reduced straightly from the mirror section 15 toward the connection end portion with the fiber core section 21 of the optical fiber 2. In addition, each of the both side surfaces 17a can be formed into the shape of an inclined surface constituted by a plurality of planes having inclination angles that are different stepwise as shown in FIG. 19C, or can be formed into the shape of an inclined surface constituted by a curved plane as shown in FIG. 19D.

On the other hand, in the first substrate 3 on the light-receiving side having the light-receiving element 12b as the optical element, as shown in FIGS. 20A and 20B, the core section 17 of the internal waveguide 16 can be formed in the shape of an inclined surface such that the width W of the core section 17 (the distance between both side surfaces 17a) is gradually reduced straightly from the connection end portion with the fiber core section 21 of the optical fiber 2 toward the mirror section 15. In addition, each of both side surfaces 17a can be formed into the shape of an inclined surface constituted by a plurality of planes having inclination angles that are different stepwise as shown in FIG. 20C, or can be formed into the shape of an inclined surface constituted by a curved plane as shown in FIG. 20D.

With this, when the optical element is the light-emitting element 12a, by tapering the core section 17 of the internal waveguide 16 (i.e., a shape of which the width is gradually reduced as it goes forward), the luminous flux emitted from the light-emitting element 12a is caused to converge. In addition, when the optical element is the light-receiving element 12b, by inversely tapering the core section 17 of the internal waveguide 16 (i.e., a shape of which the width is gradually reduced as it goes rearward), the luminous flux emitted from the fiber core section 21 of the optical fiber 2 is caused to converge. Consequently, in either case, the optical coupling efficiency is further improved.

Figure 18A:
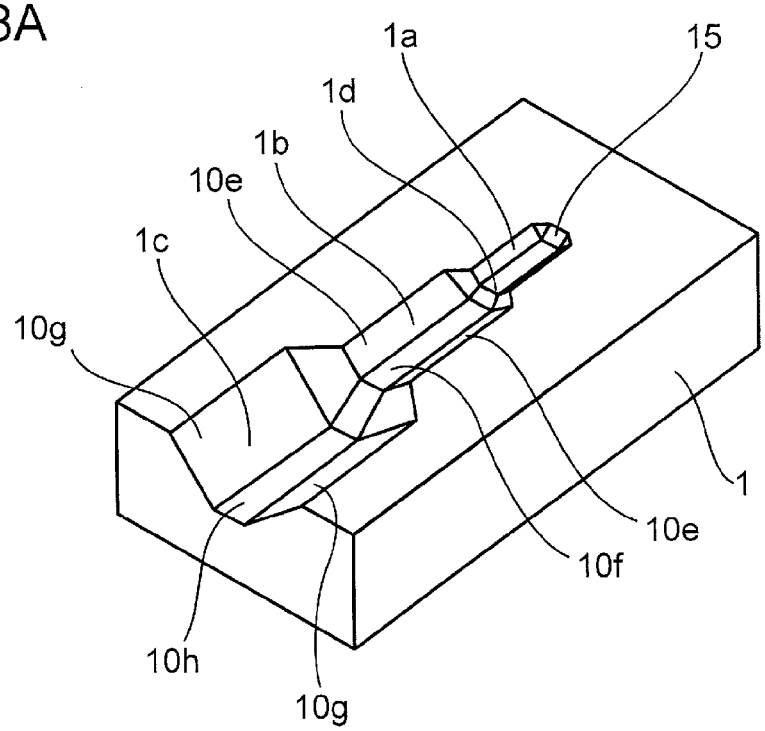
FIG. 18A is a perspective view of the first substrate.
Figure 18B:
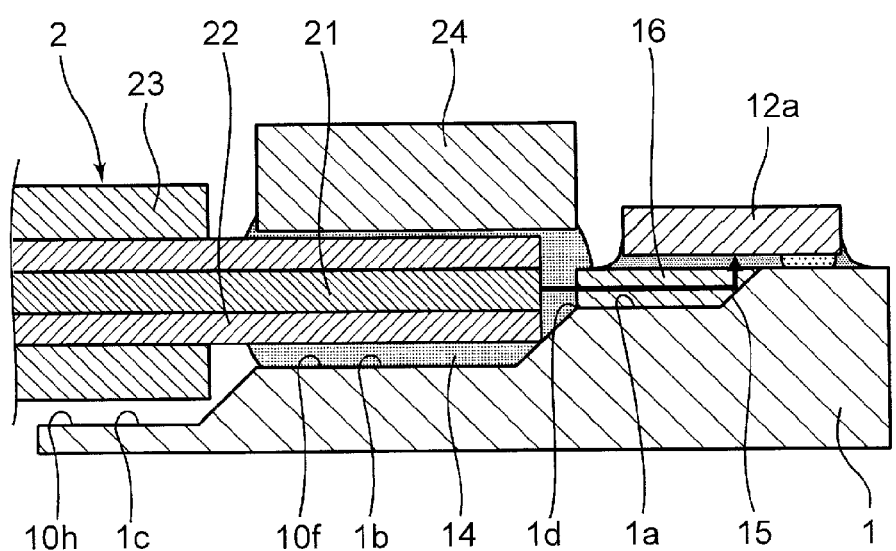
FIG. 18B is a side cross-sectional view of the first substrate.

As shown in FIGS. 18A and 18B, a third trench 1c having a substantially trapezoidal cross section that is deeper than the second trench 1b is formed continuously from the second trench 1b in the surface (upper surface) of the first substrate 1. It is possible to dispose the sheathing section 23 of the optical fiber 2 in the third trench 1c.

Specifically, the third trench 1c of the second embodiment includes a bottom surface 10h formed to have a predetermined width and two inclined surfaces 10g that come in contact with the outer periphery of the sheathing section 23 of the optical fiber 2 to support the optical fiber 2. The inclined surfaces 10g of the third trench are connected to both ends of the bottom surface 10h of the third trench 1c in the width direction and extended from the both ends to the surface of the first substrate 1 obliquely upward such that the distance between the inclined surfaces 10g is gradually increased as it goes upward. In addition, the bottom surface 10h and the inclined surfaces 10g of the third trench 1c are formed so as not to come in contact with the outer periphery of the sheathing section 23 of the optical fiber 2.

With this, it is possible to dispose the cladding section 22 of the optical fiber 2 in the second trench 1b of the first substrate 1, and also dispose the sheathing section 23 of the optical fiber 2 in the third trench 1c of the first substrate 1. Consequently, it is possible to prevent the stress from the optical fiber 2 from being concentrated on the boundary portion with the sheathing section 23 of the fiber cladding section 22.

Similarly to the fiber cladding section 22, when the sheathing section 23 is boded and fixed to the third trench 1c with the adhesive, the fixing strength of the optical fiber 2 is improved. In addition, even when a bending force or a tensile force acts on the optical fiber 2 from the outside of the module, the optical coupling portion with the internal waveguide 16 is not affected, and hence the optical coupling efficiency is not reduced.

Figure 21:
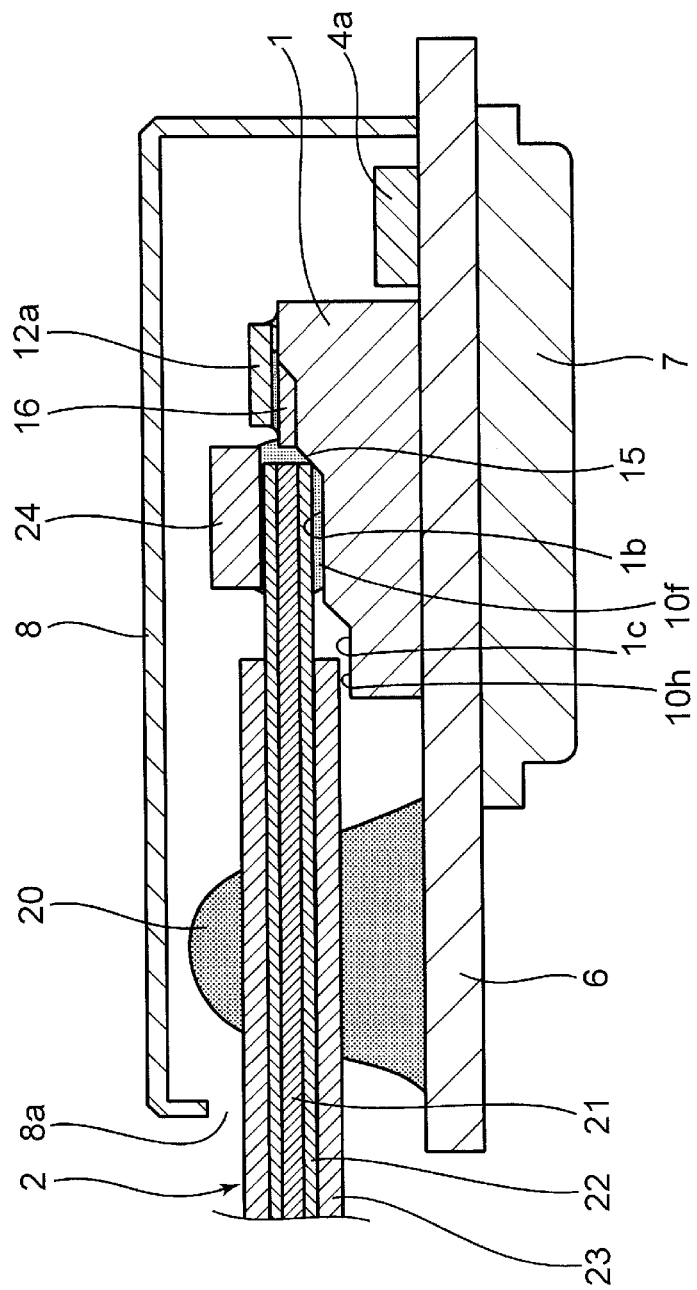
[FIG. 21]

Further, in a case where the sheathing section 23 is not bonded and fixed to the third trench 1c, as shown in FIG. 21, with an adhesive 20 thickly applied (i.e., applied so as to protrude upward) onto the surface of the second substrate 6, it is possible to fix the sheathing section 23 of the optical fiber 2 to the second substrate 6.

With such a configuration, since it is possible to dispose and fix the sheathing section 23 of the optical fiber 2 on the second substrate 6, the fixing strength of the optical fiber 2 is improved. In addition, even when the bending force or the tensile force acts on the optical fiber 2 from the outside of the module, the optical coupling portion with the internal waveguide 16 is not affected, and hence the optical coupling efficiency is not reduced. Further, when the structure in which the sheathing section 23 of the optical fiber 2 is disposed and fixed in the third trench 1c of the first substrate 1 is used in combination, the fixing strength is further improved.

Figure 22:
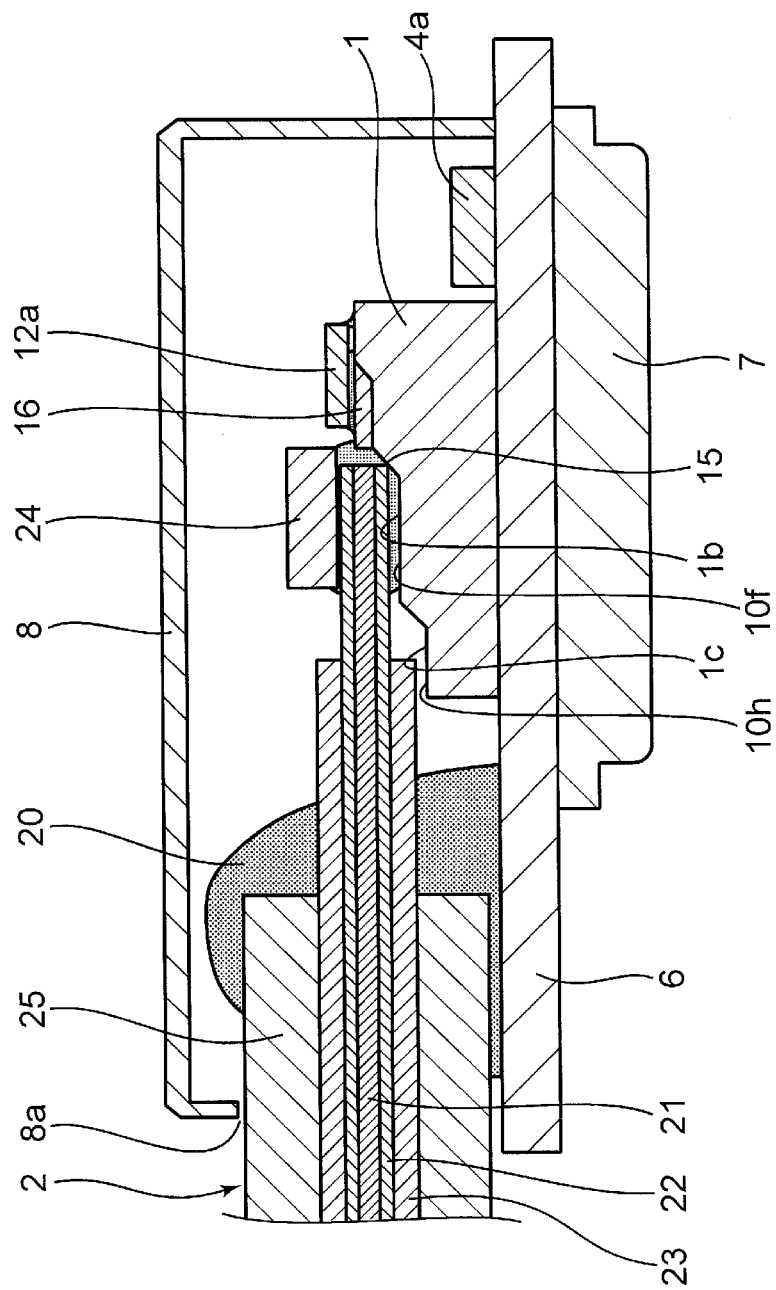
[FIG. 22]

As shown in FIG. 22, in a case where a tubular sheathing body 25 is fitted over the sheathing section 23 of the optical fiber 2, it is possible to fix the sheathing section 23 of the optical fiber 2 and the sheathing body 25 to the second substrate 6 with the adhesive 20. Note that the sheathing body 25 is not limited to the one fitted over the sheathing section 23 as long as the sheathing body covers the outer periphery of the sheathing section 23.

In addition, the sheathing body 25 may be bonded to the portion of the third trench 1c of the first substrate 1 (not shown).

The sheathing section 23 is a layer having a thickness of about 5 to 100 μm that is formed of, e.g., a UV-setting resin, while the sheathing body 25 is formed of, e.g., PCV, nylon, or thermoplastic polyester elastomer (e.g., Hytrel (registered trademark)). The outer diameter of the sheathing body 25 is, e.g., about 900 microns in the case of a single-core optical fiber.

With such a configuration, it is possible to dispose the sheathing body 25 on the second substrate 6, and fix the sheathing body 25 to the second substrate 6 together with the sheathing section 23 of the optical fiber 2. With this, the fixing strength of the optical fiber 2 is improved. In addition, even when the bending force or the tensile force acts on the optical fiber 2 from the outside of the module, the optical coupling portion with the internal waveguide 16 is not affected, and hence the optical coupling efficiency is not reduced. Further, when the structure in which the sheathing section 23 of the optical fiber 2 is disposed in and fixed to the third trench 1c of the first substrate 1 is used in combination, the fixing strength is further improved. Additionally, with the thickness of the sheathing body 25, it is possible to prevent a flection caused by the weight of the optical fiber 2 with, and an external force becomes less likely to be applied to the bonding portion between the optical fiber 2 and the substrate 1. With this, the stress is less likely to occur in the optical coupling portion between the optical fiber 2 and the internal waveguide 16, and hence the optical coupling efficiency becomes less likely to be reduced. Note that, even when only the sheathing body 25 is fixed to the second substrate 6 with the adhesive 20, the same operation and effect can be achieved.

In the optical module according to the second embodiment, in a case where the inclination angle of the mirror section 15 is 45 degrees, the optical coupling efficiency becomes excellent.

In addition, in a case where the first substrate 1 is made of silicon (Si), the first trench la and the second trench 1b can be formed by anisotropic etching of silicon. According to this, it is possible to perform trench processing that utilizes the crystal orientation of silicon, and it is possible to form the high-accuracy mirror shape in the first trench 1a and reduce a displacement of the position of the optical fiber 2 in the second trench 1b.

Further, as the material of the internal waveguide 16, it is possible to use a photosensitive resin. According to this, as compared with an inorganic internal waveguide that is formed by repeating ion doping or a deposition method, the internal waveguide 16 made of the photosensitive resin is inexpensive and can be easily formed.

Furthermore, it is possible to form the silicon oxide film on the surface of the first substrate 1 including the internal portion of the first trench 1a to thereby increase the refractive index of the core section 17 of the internal waveguide 16 to be larger than that of the silicon oxide film. According to this, by filling the first trench 1a with the material of the core section 17 of the internal waveguide 16, it is possible to easily form the internal waveguide 16.

Figure 23A:
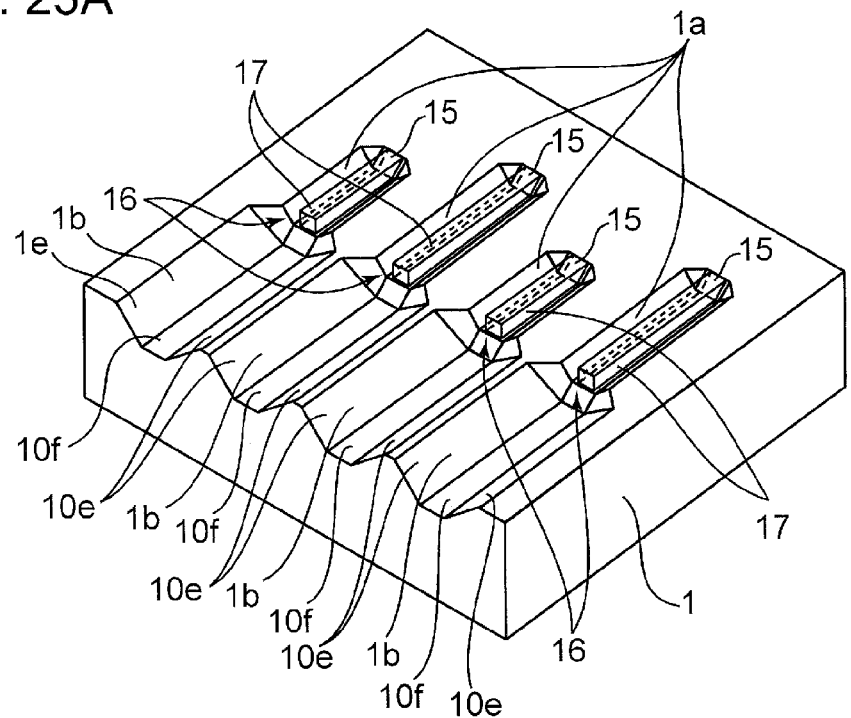
FIG. 23A is a perspective view of the first substrate.
Figure 23B:
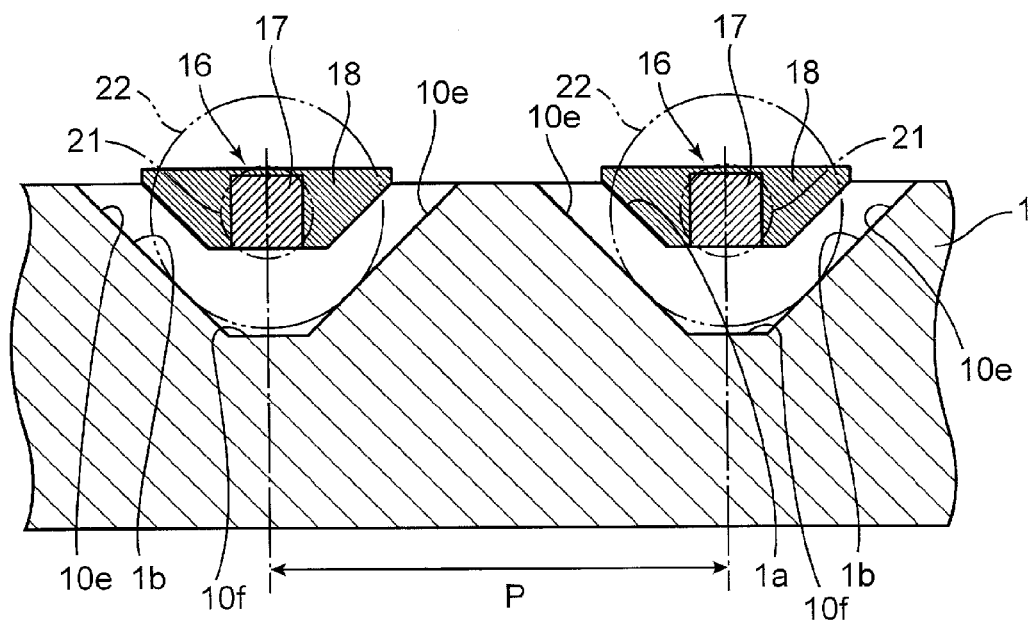
FIG. 23B is a front cross-sectional view of the first substrate.

In the multi-channel optical module according to the second embodiment of the present invention shown in FIGS. 23A and 23B, a plurality of the first trenches 1a and a plurality of the second trenches 1b are formed, the plurality of the first trenches 1a are disposed in parallel with each other, and the plurality of the second trenches 1b are also disposed in parallel with each other.

Specifically, in the optical module shown in FIGS. 23A and 23B, on the surface of the first substrate 1, as shown in FIG. 23A, a plurality of the first trenches (waveguide formation trenches) 1a each having a substantially trapezoidal cross section are disposed in parallel with each other in a state where the first trenches 1a are separated from each other with the material of the first substrate 1. Similarly to the first embodiment, the lengths of the plurality of the first trenches 1a are set such that the lengths of the adjacent first trenches 1a are different from each other.

Further, in the surface of the first substrate 1, a plurality of the second trenches 1b each having the substantially trapezoidal cross section that are deeper than the first trenches 1a are formed continuously from the end portions of the individual first trenches 1a in the front and rear direction.

As shown in FIG. 23A, at the tip portion of each first trench 1a, the mirror section 15 for changing the optical path is formed. As shown in FIG. 23B, the internal waveguide 16 that is optically coupled to the light-emitting element 12a corresponding to the first trench 1a is provided in each first trench 1a.

The internal waveguide 16 is constituted by the core section 17 having a substantially square cross section and a high refractive index of light propagation, and the cladding section 18 having a refractive index lower than that of the core section 17. As shown in FIG. 23B, both left and right surfaces (both side surfaces) of the core section 17 are covered with the cladding section 18. In addition, the upper surface of the core section 17 is thinly covered with the cladding section 18.

Each of the second trenches 1b shown in FIGS. 23A and 23B includes the bottom surface 10f formed to have a predetermined width and the two inclined surfaces 10e that come in contact with the outer periphery of the fiber cladding section 22 of the optical fiber 2 to support the outer periphery thereof. The inclined surfaces 10e are connected to both ends of the bottom surface 10f in the width direction and are extended from the both ends to the surface (upper surface) of the first substrate 1 obliquely upward such that the distance between the inclined surfaces 10e is gradually increased as it goes upward. The outer periphery of the fiber cladding section 22 of the optical fiber 2 comes in contact with the inclined surfaces 10e, and it is thereby possible to perform centering of the fiber cladding section 22.

In addition, the bottom surface 10f is formed so as not to be in contact with the outer periphery of the fiber cladding section 22 when the inclined surfaces 10e and the outer periphery of the fiber cladding section 22 of the optical fiber 2 come in contact with each other.

In the configuration shown in FIGS. 23A and 23B, since the plurality of the first trenches 1a are disposed in the state where the first trenches 1a are separated from each other with the material of the first substrate 1, it is possible to prevent the optical signal passing through each first trench 1a from being leaked (cross talk) to the adjacent first trench 1a.

In addition, as shown in FIG. 23B, an interval P between the core sections 17 of the adjacent internal waveguides 16 is not particularly limited in the present invention, and the interval P can be set arbitrarily. For example, the interval P between the core sections 17 may be set to about 250 µm in consideration of the disposition of the optical fiber of a conventionally known optical fiber array at an interval of 250 µm.

The size of the second trench 1b is not particularly limited in the present invention. The size of the second trench 1b may be set to a size corresponding to the optical fiber having the outer diameter of the cladding section 22 of about 125 µm in consideration of the outer diameter of the most widely used small-diameter optical fiber of 125 µm. Note that, in order to prevent the cross talk, the second trench 1b is preferably separated from the adjacent second trench 1b as shown in FIG. 23.

Figure 24:
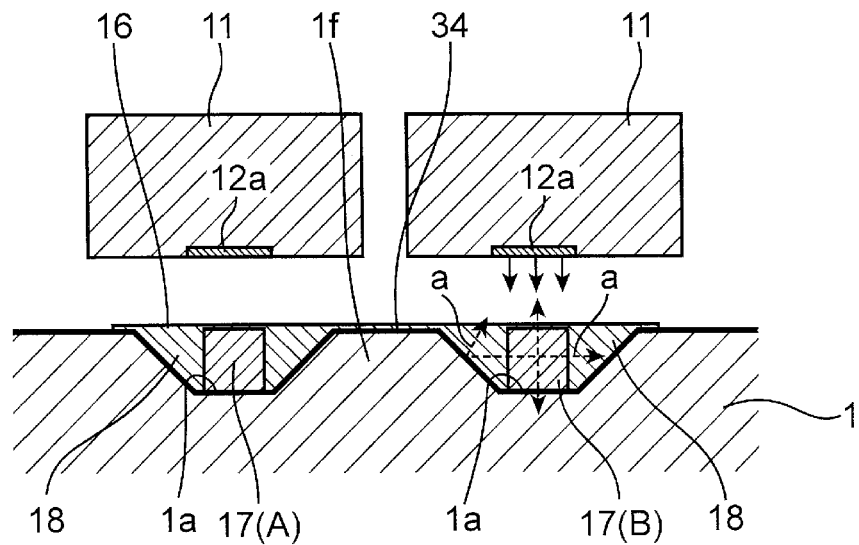
[FIG. 24]

Further, as another modification of the second embodiment of the present invention, in the optical module shown in FIG. 24, in the structure in which a plurality of the first trenches 1a are disposed, an oxide film layer 34 is formed on the entire surface of the substrate 1 (i.e., the entire surface of the first trenches 1a and the entire surface of the partition wall portion 1f). The partition wall portion 1f functioning as a shielding section is a portion protruding upward between the first trenches 1a on the substrate 1. The partition wall portion 1f shields the first trench 1a such that a scattered component a of the reflected light of the mirror section 15 between the first trenches 1a is not leaked.

The oxide film layer 34 is capable of reflecting the optical signal such that the optical signal is not leaked to the outside of the first trench 1a, and is also capable of preventing the leakage of the scattered component a of the reflected light of the mirror section 15. According to the configuration, the oxide film layer 34 serves as the reflection layer that reflects the optical signal, and hence it is possible to prevent the leakage (cross talk) of the optical signal more effectively. Strictly speaking, the optical signal including infrared rays and the like has a property that the optical signal passes through the substrate 1 made of silicon or the like while being attenuated. However, as described above, by reflecting the optical signal using the oxide film layer 34, it is possible to improve the cross talk prevention effect.

Note that, in FIG. 24, although the gap between an optical element 11 having the light-emitting section 12a and the substrate 1 is largely illustrated for easy visual recognition of the optical path, the gap is actually extremely small, and large cross talk does not occur. The same applies to FIGS. 25 and 26.

Figure 25:
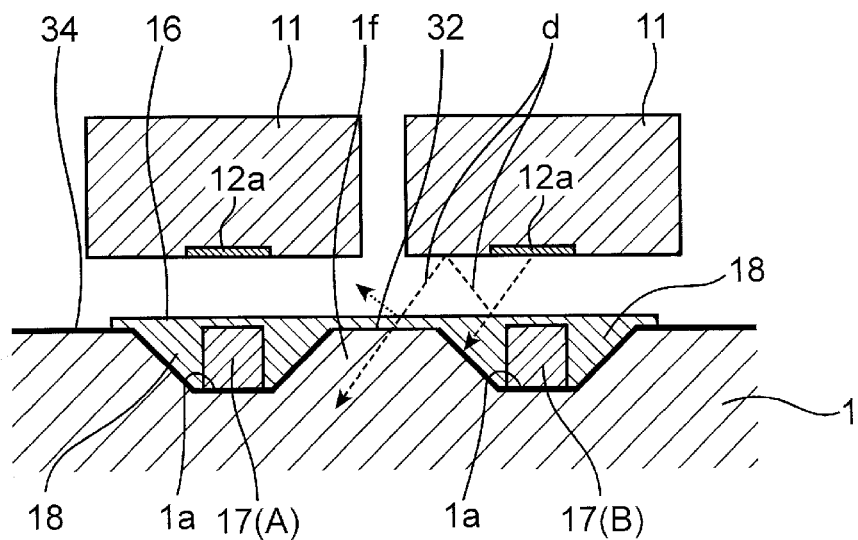
[FIG. 25]

Further, as still another modification of the second embodiment of the present invention, in the optical module shown in FIG. 25, in the structure in which the oxide film layer 34 is formed on the surface of the substrate 1 as shown in FIG. 24, the oxide film layer 34 on the surface of the upwardly protruding partition wall portion 1f is partially removed, and a removal portion 32 is thereby formed. According to the configuration, in a case where leaked light d that is multiply reflected between the optical element 11 having the light-emitting section 12a and cladding section 18 occurs, the leaked light d can be absorbed into the first substrate 1 from the removal portion 32 of the oxide film layer 34.

Figure 26:
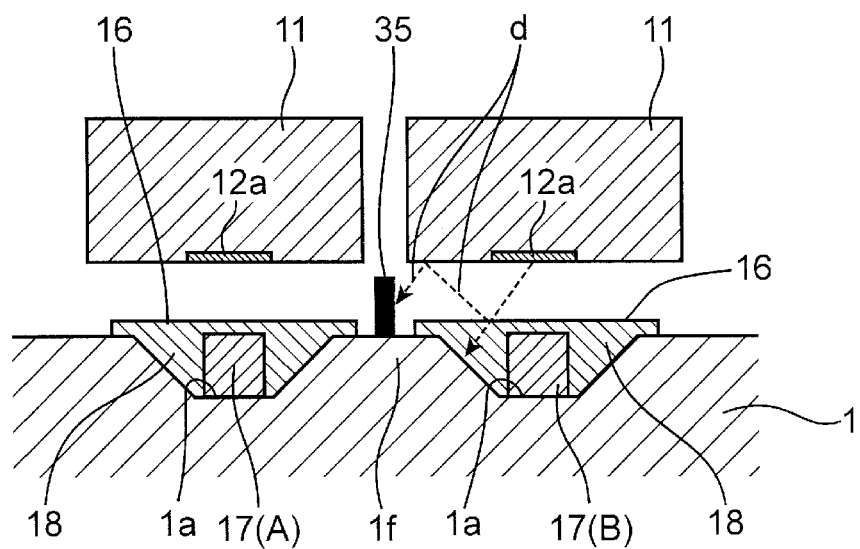
[FIG. 26]

Furthermore, as yet another modification of the second embodiment of the present invention, in the optical module shown in FIG. 26, on the surface of the upwardly protruding partition wall portion 1*f* of the first substrate 1, a light absorber 35 is disposed along the partition wall portion 1*f*. As the light absorber 35, for example, opaque acrylic or epoxy resin is used. According to the configuration, in the case where the leaked light d that is multiply reflected between the optical element 11 having the light-emitting section 12*a* and the cladding section 18 occurs, it is possible to cause the light absorber 35 to absorb the leaked light d to stop the leakage of light.

In the optical element 11 shown in each of FIGS. 24 to 26, although the light-emitting elements 12*a* are separated from each other, the light-emitting element 12*a* and the light-receiving element 12*b* may be mounted in combination.

Figure 27A:
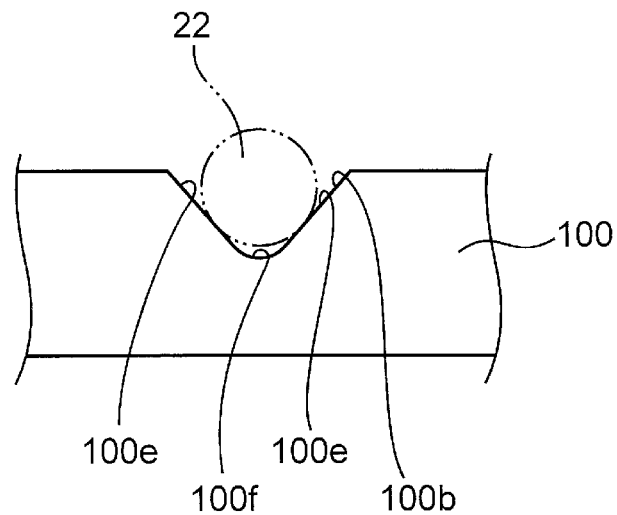
FIG. 27A is a cross-sectional view of another modification of the second trench according to the second embodiment of the present invention.

In the second embodiment, although the bottom surface of the second trench of the first substrate is formed into the flat shape, the present invention is not limited to this mode, and the shape of the bottom surface can be appropriately changed. For example, as shown in FIG. 27A, a bottom surface 100*f* of a second trench 100*b* of a first substrate 100 may be formed into a curved shape, and inclined surfaces 100*e* may be formed to be extended from both ends of the bottom surface 100*f* in the curved shape in the width direction obliquely upward.

Figure 27B:
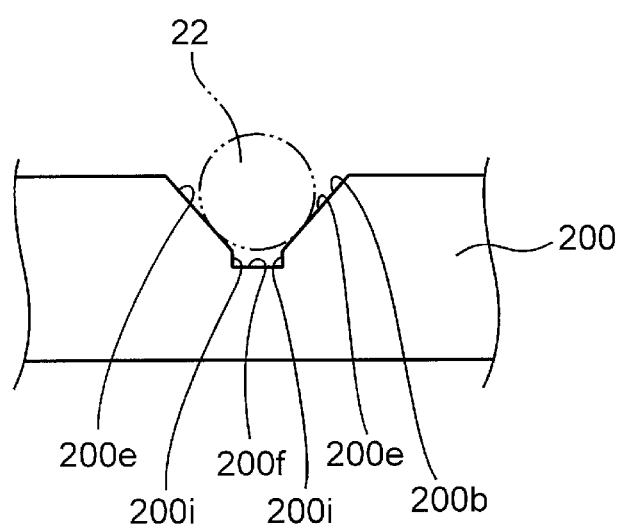
FIG. 27B is a cross-sectional view of still another modification of the second trench according to the second embodiment of the present invention.

In the second embodiment, although the bottom surface and the inclined surfaces of the second trench of the first substrate are directly connected to each other, the present invention is not limited to this mode, and the mode can be appropriately changed. For example, as shown in FIG. 27B, inclined surfaces 200*e* and a bottom surface 200*f* may also be indirectly connected to each other via connection sections 200*i*.

Specifically, a second trench 200*b* of a first substrate 200 includes the connection sections 200*i* that are vertically extended from both ends of the bottom surface 200*f* in the width direction, and the inclined surfaces 200*e* are formed to be extended obliquely upward from the connection sections 200*i*. Note that, similarly to the second trench, the third trench may also have the bottom surface in the curved shape and the bottom surface and the inclined surfaces may also be indirectly connected to each other via the connection sections, and the mode can be appropriately changed.

Figure 28A:
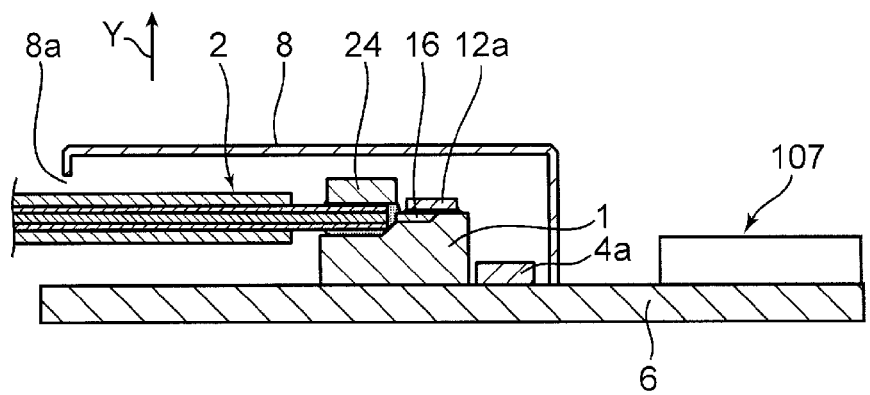
FIG. 28A is a cross-sectional view of the optical module in which a connector is provided on the upper surface of the second substrate.
Figure 28B:
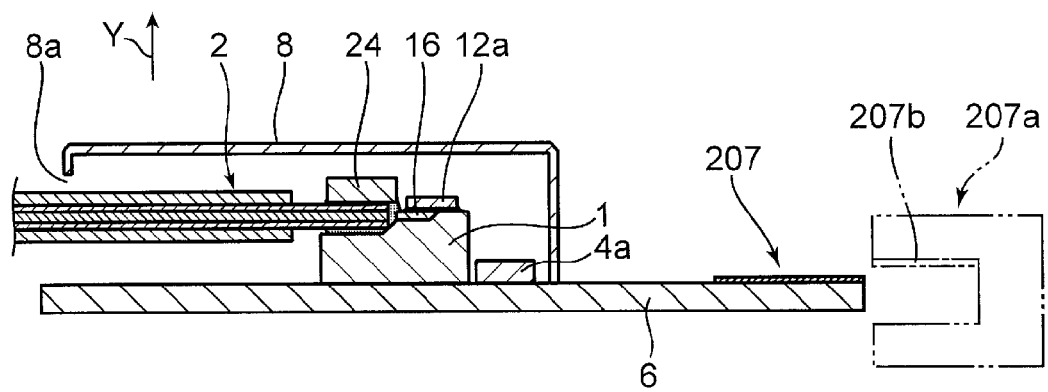
FIG. 28B is a cross-sectional view of the optical module in which an electric terminal is provided on the upper surface of the second substrate.

In the second embodiment, although the connector 7 is attached to the back surface (lower surface) of the second substrate 6, the present invention is not limited to this mode and, e.g., as shown in FIG. 28A, a connector 107 can be disposed on the surface (upper surface) of the second substrate 6, and the mode can be appropriately changed.

In addition, instead of the connector 7, an electric terminal 207 may also be provided on the surface of the second substrate 6. Further, another connector 207*a* that is detachably fitted over the end portion of the second substrate 6 is provided with an electric terminal 207*b* that is connected to the electric terminal 207, and the other connector 207*a* is fitted over the second substrate 6. With such a configuration, the electric terminal 207 may be connected to the electric terminal 207*b* of the other connector 207*a*.

Thus, the optical module according to the second embodiment of the present invention includes the substrate in which the plurality of the first trenches and the plurality of the second trenches that are deeper than the first trenches are continuously formed in the surface, the internal waveguide provided in each first trench of the substrate, the mirror section for changing the optical path provided at the tip portion of the first trench, the optical element that are mounted on the surface of the substrate so as to oppose the mirror sections and that emits the optical signal to the core section of the internal waveguide via the mirror section or receives the optical signal from the core section of the internal waveguide via the mirror section, and the optical fiber as the external waveguide having the fiber core section that is optically connected to the cladding section provided in the second trench and the core section of the internal waveguide, the second trench includes the bottom surface formed to have the predetermined width and the inclined surfaces that are connected to both ends of the bottom surface in the width direction to support the outer periphery of the fiber cladding section.

According to the configuration, the internal waveguide having the core section is provided in the first trench of the substrate, and the fiber core section of the optical fiber disposed in the second trench of the substrate is optically coupled to the core section of the internal waveguide. The optical signal is emitted to the core section of the internal waveguide via the mirror section in the case where the optical element is the light-emitting element, and the optical signal from the core section of the internal waveguide is received via the mirror section in the case where the optical element is the light-receiving element.

Thus, since the internal waveguide is interposed between the tip of the fiber core section of the optical fiber and the mirror section, the luminous flux emitted from the light-emitting element does not spread, and the luminous flux emitted from the fiber core section of the optical fiber does not spread. Consequently, since the propagation loss of the optical signal between the tip of the fiber core section of the optical fiber and the mirror section is almost eliminated in any direction, the optical coupling efficiency is improved.

For example, in the flip chip mounting in which the light-emitting surface of the optical element is on the substrate side, it is desirable to dispose the optical fiber close to the position immediately below the optical element. However, there are cases where it is difficult to dispose the optical fiber close to the position immediately below the optical element depending on the size of the outer diameter of the fiber. In addition, when the depth of the trench in the substrate is increased, the distance between the optical fiber and the optical element is increased. Even in these cases, since the internal waveguide is interposed therebetween as described above, it becomes possible to almost eliminate the propagation loss of the optical signal between the tip of the fiber core section of the optical fiber and the mirror section, and it is possible to improve the optical coupling efficiency.

Further, since the second trench has the bottom surface, unlike the trench having the V-shaped cross section, it is not necessary to increase the depth of the trench to increase the lengths of the inclined surfaces. Accordingly, in a case where the second trench is formed by etching, the second trench can be formed easily and in a short period of time as compared with the trench having the V-shaped cross section.

A configuration can be adopted in which, in the case where the optical element is the light-emitting element, the core section of the internal waveguide has the inclined surfaces that gradually reduce the width of the core section from the mirror section toward the connection end portion with the fiber core section of the optical fiber.

According to the configuration, when the optical element is the light-emitting element, by tapering the core section of the internal waveguide, the luminous flux emitted from the light-emitting element is caused to converge. Consequently, the optical coupling efficiency is further improved.

A configuration can be adopted in which, in the case where the optical element is the light-receiving element, the core section of the internal waveguide has the inclined surfaces that gradually reduce the width of the core section from the connection end portion with the fiber core section of the optical fiber toward the mirror section.

According to the configuration, when the optical element is the light-receiving element, by inversely tapering the core section of the internal waveguide, the luminous flux emitted from the fiber core section of the optical fiber is caused to converge. Consequently, the optical coupling efficiency is further improved.

A configuration can be adopted in which the width of the core section of the internal waveguide is smaller than the width of the upper end of the first trench.

In a case where the width of the core section of the internal waveguide is equal to the width of the upper end of the first trench, the luminous flux from the optical element spreads in the width direction in the core section, and a part of the luminous flux may not reach the fiber core section of the optical fiber. To cope with this, by making the width of the core section smaller than the width of the upper end of the first trench, preferably making the width of the core section substantially equal to the width of the fiber core section, it is possible to cause almost all of the luminous flux to reach the fiber core section of the optical fiber, and hence the optical coupling efficiency is improved.

A configuration can be adopted in which the first trench has the substantially trapezoidal cross section and the bottom surface of the first trench is wider than the core section of the internal waveguide.

According to the configuration, when the core section of the internal waveguide is subjected to patterning (photo-cured) during the formation of the core section, since the unnecessary reflection on the bottom surface is prevented, it is possible to obtain the high-accuracy core shape.

A configuration can be adopted in which the third trench deeper than the second trench is formed in the surface of the substrate continuously from the second trench, and the third trench is fixed to the sheathing section of the optical fiber.

According to the configuration, since the sheathing section of the optical fiber can be disposed in the third trench of the first substrate, it is possible to prevent the stress from the optical fiber from being concentrated on the boundary portion with the sheathing section of the fiber cladding section.

In addition, since the third trench includes the bottom surface, unlike the trench having the V-shaped cross section, it is not necessary to increase the depth of the trench to increase the lengths of the inclined surfaces and, in a case where the third trench is formed by, e.g., etching, the third trench can be formed easily and in a short period of time as compared with the trench having the V-shaped cross section.

A configuration can be adopted in which the substrate is disposed on another substrate larger in size than the substrate, and a sheathing section of the optical fiber is fixed to the other substrate.

According to the configuration, since the sheathing section of the optical fiber can be disposed on and fixed to the other substrate, the fixing strength of the optical fiber is improved. In addition, even when the bending force or the tensile force acts on the optical fiber from the outside of the module, the optical coupling portion with the internal waveguide is not affected, and hence the optical coupling efficiency is not reduced.

A configuration can be adopted in which the substrate is disposed on another substrate larger in size than the substrate, a sheathing body is fixed to an outer periphery of a sheathing section of the optical fiber, and the sheathing body is fixed to the other substrate.

According to the configuration, since the sheathing body can be disposed on and fixed to the other substrate, the fixing strength of the optical fiber is improved. In addition, even when the bending force or the tensile force acts on the optical fiber from the outside of the module, the optical coupling portion with the internal waveguide is not affected, and hence the optical coupling efficiency is not reduced. Additionally, with the thickness of the sheathing body, it is possible to prevent the flection caused by the weight of the optical fiber to thereby prevent the external force from being applied to the bonding portion of the optical fiber. With this, the stress is less likely to occur in the optical coupling portion with the internal waveguide, and hence the optical coupling efficiency becomes less likely to be reduced.

A configuration can be adopted in which the plurality of the first trenches are disposed on the substrate so as to be separated from each other.

According to the configuration, since the plurality of the first trenches $1a$ are disposed so as to be separated from each other, it is possible to prevent a phenomenon in which the optical signal passing through each first trench $1a$ is leaked and the optical signal passing through the adjacent first trench $1a$ is affected, i.e., what is called the cross talk. In addition, with this, the optical coupling efficiency in each first trench $1a$ is enhanced.

Industrial Applicability

The present invention is useful for the optical module including the optical element.

EXPLANATION OF REFERENCE NUMERALS 1 first substrate
$1a$, $1a$-1, $1a$-2 first trench
$1b$, $1b$-1, $1b$-2 second trench
$1c$ third trench
$1e$, $1f$, $1g$ partition wall portion
2 optical fiber (external waveguide)
6 second substrate (another substrate)
$10e$, $100e$ inclined surface of second trench
$10f$, $100f$ bottom surface of second trench
$12a$ light-emitting element (optical element)
$12b$ light-receiving element (optical element)
13 optically transparent resin
15 mirror section
16-1, 16-2 internal waveguide
17 core section
18 cladding section
21 fiber core section
22 fiber cladding section
23 sheathing section
25 sheathing body
W1 to W3 width
26 convex layer (absorber)
L1, L2 length

What is claimed is:

1. An optical module comprising:
a substrate that is formed with a plurality of first trenches in a surface thereof;
an internal waveguide that is provided in each of the plurality of first trenches and has a core section;
a mirror section for changing an optical path, formed at each of tip portions of the plurality of first trenches; and
a plurality of optical elements, each of the plurality of optical elements is mounted on the surface of the substrate so as to oppose the mirror section, respectively, and the plurality of optical elements include a light-emitting element which emits an optical signal to the core section of the internal waveguide via the mirror section and a light-receiving element which receives the optical signal from the core section of the internal waveguide via the mirror section, wherein the plurality of first trenches of the substrate are formed independently of each other and substantially in parallel with each other, lengths of the adjacent first trenches from an end surface of the substrate are different from each other, and the light-emitting element is mounted on the surface of the substrate so as to oppose the mirror section formed at a tip portion of the internal waveguide shorter in length than the internal waveguide optically coupled to the light-receiving element.

2. The optical module according to claim 1, further comprising:

an external waveguide that has a core section optically coupled to the core section of the internal waveguide, wherein a second trench extending from the first trench of the internal waveguide is formed in the surface of the substrate, and an optical axis of the internal waveguide and an optical axis of the external waveguide are set so as to match with each other by fitting and fixing the external waveguide in and to the second trench.

3. The optical module according to claim 2, wherein a partition wall portion is formed between the adjacent second trenches so as not to be separated from a partition wall portion between the adjacent first trenches.

4. The optical module according to claim 1, further comprising:

an external waveguide that has the core section optically coupled to a core section of the internal waveguide, wherein the external waveguide is a multi-channel optical fiber.

5. The optical module according to claim 1, further comprising:

an external waveguide that has a core section optically coupled to the core section of the internal waveguide, wherein the external waveguide is a multi-channel flexible waveguide film.

6. The optical module according to claim 1, wherein a convex layer made of a material identical with a material of a cladding section of the internal waveguide is formed on the surface of the substrate between the optical elements.

7. The optical module according to claim 1, further comprising:

an external waveguide that has a core section optically coupled to the core section of the internal waveguide, wherein a plurality of second trenches deeper than the plurality of first trenches and each having a substantially V-shaped cross section are formed in the surface of the substrate continuously from the first trenches, and the external waveguide includes an optical fiber that has a fiber cladding section disposed in each of the plurality of second trenches and a fiber core section as the core section of the external waveguide.

8. The optical module according to claim 1, further comprising:

an external waveguide that has a core section optically coupled to the core section of the internal waveguide, wherein a plurality of second trenches deeper than the plurality of first trenches are formed in the surface of the substrate continuously from the first trenches, the external waveguide includes an optical fiber that has a fiber cladding section disposed in each of the second trenches and a fiber core section as the core section of the external waveguide, and the second trench includes a bottom surface that is formed to have a predetermined width and inclined surfaces that are connected to both ends of the bottom surface in a width direction and support an outer periphery of the fiber cladding section.

9. The optical module according to claim 8, wherein the core section of the internal waveguide has inclined surfaces that gradually reduce a width of the core section from the mirror section which opposes the light-emitting element toward a connection end portion with the fiber core section of the optical fiber.

10. The optical module according to claim 8, wherein the core section of the internal waveguide has inclined surfaces that gradually reduce a width of the core section from a connection end portion with the fiber core section of the optical fiber toward the mirror section which opposes the light-receiving element.

11. The optical module according to claim 8, wherein the width of the core section of the internal waveguide is smaller than a width of an upper end of the first trench.

12. The optical module according to claim 8, wherein the first trench has a substantially trapezoidal cross section, and a bottom surface of the first trench is wider than the core section of the internal waveguide.

13. The optical module according to claim 8, wherein a third trench deeper than the second trench is formed in the surface of the substrate continuously from the second trench, and the third trench is bonded to a sheathing section of the optical fiber.

14. The optical module according to claim 8, wherein the substrate is disposed on another substrate larger in size than the substrate, and a sheathing section of the optical fiber is fixed to the other substrate.

15. The optical module according to claim 8, wherein the substrate is disposed on another substrate larger in size than the substrate, a sheathing body is fixed to an outer periphery of a sheathing section of the optical fiber, and the sheathing body is fixed to the other substrate.

\* \* \* \* \*